(12) United States Patent
Choi et al.

(10) Patent No.: US 12,183,866 B2
(45) Date of Patent: Dec. 31, 2024

(54) DISPLAY DEVICE USING MICRO LED, AND MANUFACTURING METHOD THEREFOR

(71) Applicant: LG ELECTRONICS INC., Seoul (KR)

(72) Inventors: Hwanjoon Choi, Seoul (KR); Kyoungtae Wi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 437 days.

(21) Appl. No.: 17/623,855

(22) PCT Filed: Jul. 19, 2019

(86) PCT No.: PCT/KR2019/008980
§ 371 (c)(1),
(2) Date: Dec. 29, 2021

(87) PCT Pub. No.: WO2021/015306
PCT Pub. Date: Jan. 28, 2021

(65) Prior Publication Data
US 2022/0367771 A1    Nov. 17, 2022

(30) Foreign Application Priority Data

Jul. 19, 2019 (KR) .................. 10-2019-0087673

(51) Int. Cl.
| | |
|---|---|
| H01L 33/62 | (2010.01) |
| H01L 23/00 | (2006.01) |
| H01L 25/075 | (2006.01) |
| H01L 33/54 | (2010.01) |
| H01L 33/56 | (2010.01) |

(Continued)

(52) U.S. Cl.
CPC .............. *H01L 33/62* (2013.01); *H01L 24/29* (2013.01); *H01L 24/32* (2013.01); *H01L 24/83* (2013.01);
(Continued)

(58) Field of Classification Search
CPC .................................................. H01L 25/0753
See application file for complete search history.

(56) References Cited

U.S. PATENT DOCUMENTS

2015/0255505 A1    9/2015  Jeoung et al.
2018/0287098 A1*  10/2018  Hu ....................... H10K 59/879
(Continued)

FOREIGN PATENT DOCUMENTS

| EP | 3506353 | 7/2019 |
|---|---|---|
| EP | 3989281 | 4/2022 |

(Continued)

OTHER PUBLICATIONS

Korean Intellectual Property Office Application No. 10-2019-0087673, Office Action dated Dec. 13, 2023, 4 pages.

(Continued)

*Primary Examiner* — Moazzam Hossain
(74) *Attorney, Agent, or Firm* — LEE, HONG, DEGERMAN, KANG & WAIMEY

(57) ABSTRACT

Disclosed in the present specification is a micro LED display device, and a manufacturing method therefor, the method forming, in advance, an anisotropic conductive adhesive paste layer only on a conductive electrode part of a semiconductor light emitting element and on a peripheral part thereof, and then transferring the anisotropic conductive adhesive paste layer to a wiring substrate, thereby simultaneously performing a transfer step and a stable wiring step.

10 Claims, 26 Drawing Sheets

(51) Int. Cl.
    *H01L 33/60* (2010.01)
    *H01L 33/00* (2010.01)
(52) U.S. Cl.
    CPC .......... *H01L 25/0753* (2013.01); *H01L 33/54* (2013.01); *H01L 33/60* (2013.01); *H01L 24/95* (2013.01); *H01L 33/0093* (2020.05); *H01L 33/56* (2013.01); *H01L 2224/29006* (2013.01); *H01L 2224/29386* (2013.01); *H01L 2224/2949* (2013.01); *H01L 2224/29499* (2013.01); *H01L 2224/32013* (2013.01); *H01L 2224/32227* (2013.01); *H01L 2224/83005* (2013.01); *H01L 2224/83201* (2013.01); *H01L 2224/95001* (2013.01); *H01L 2224/95133* (2013.01); *H01L 2924/05341* (2013.01); *H01L 2924/05442* (2013.01)

(56) References Cited

U.S. PATENT DOCUMENTS

2019/0131282 A1  5/2019  Liu et al.
2020/0083415 A1  3/2020  Kim et al.

FOREIGN PATENT DOCUMENTS

| JP | 2013-526052 | 6/2013 |
| KR | 10-2015-0039689 | 4/2015 |
| KR | 101620469 | 5/2016 |
| KR | 10-2017-0096471 | 8/2017 |
| KR | 10-2018-0103093 | 9/2018 |
| KR | 10-2018-0114439 | 10/2018 |
| KR | 10-1946166 | 2/2019 |
| KR | 1020190082691 | 7/2019 |
| WO | 2017142315 | 8/2017 |
| WO | 2018092977 | 5/2018 |

OTHER PUBLICATIONS

PCT International Application No. PCT/KR2019/008980, International Search Report dated Apr. 17, 2020, 12 pages.
European Patent Office Application Serial No. 19938629.3, extended Search Report dated Mar. 3, 2023, 8 pages.

\* cited by examiner

DISPLAY DEVICE USING MICRO LED, AND MANUFACTURING METHOD THEREFOR

CROSS-REFERENCE TO RELATED APPLICATIONS

This application is the National Stage filing under 35 U.S.C. 371 of International Application No. PCT/KR2019/008980, filed on Jul. 19, 2019, which claims the benefit of earlier filing date and right of priority to Korean Application No. 10-2019-0087673, filed on Jul. 19, 2019, the contents of which are all hereby incorporated by reference herein their entirety.

TECHNICAL FIELD

The present disclosure relates to a display device and, more particularly, to a display device based on a micro light emitting diode (LED) and manufacturing method thereof

BACKGROUND ART

Recently, in a field of a display technology, display devices having excellent characteristics such as thinness, flexibility, and the like have been developed. On the other hand, currently commercialized major displays are represented by a LCD (liquid crystal display) and an OLED (organic light emitting diode).

However, the LCD has a response time that is not fast, and is difficult to be flexibly implemented.

On the other hand, LED (light emitting diode), which is a well-known semiconductor light-emitting element that converts electric current into light, has been used as a light source for a display image of an electronic device including an information and communication device along with a GaP:N-based green LED, starting with commercialization of a red LED using a GaAsP compound semiconductor in 1962. Accordingly, a method for solving the above-described problems by implementing a display using the semiconductor light-emitting element may be proposed. Such light emitting diode has various advantages, such as long lifespan, low power consumption, excellent initial driving characteristics, high vibration resistance, and the like, compared to a filament-based light-emitting element.

However, to implement a large area high pixel display device based on semiconductor light emitting elements, a very large number of semiconductor light emitting elements need be stably assembled or transferred to a wiring substrate of the display device.

In addition, it is necessary to minimize defect issues in a wiring process for electrically connecting the wiring substrate and the semiconductor light emitting elements after the assembling or transferring.

Accordingly, the present disclosure proposes a new type of display device in which semiconductor light emitting elements are stably transferred to a wiring substrate and wiring is performed at the same time and manufacturing method thereof.

DISCLOSURE

Technical Problem

The object of an embodiment of the present disclosure is to provide a display device based on a semiconductor light emitting element and manufacturing method thereof.

The object of another embodiment of the present disclosure is to provide a display device in which a semiconductor light emitting element is transferred to a display substrate and a wiring process is stably performed at the same time and manufacturing method thereof Furthermore, the object of another embodiment of the present disclosure is to solve various problems not mentioned herein. Those skilled in the art may understand it through the full text of the specification and drawings.

Technical Solution

To achieve these objects and other advantages and in accordance with the purpose of the disclosure, as embodied and broadly described herein, a method of manufacturing a display device based on a semiconductor light emitting element is provided. The method may include: forming the semiconductor light emitting element on a growth substrate; transferring the semiconductor light emitting element to a first temporary substrate; transferring the semiconductor light emitting element on the first temporary substrate to a second temporary substrate having a protective layer; forming an anisotropy conductive adhesive paste layer on an upper surface of the semiconductor light emitting element transferred to the second temporary substrate; and transferring the semiconductor light emitting element located on the second temporary substrate to a wiring substrate having a wiring electrode formed thereon. The semiconductor light emitting element transferred to the wiring substrate may be provided with the anisotropy conductive adhesive paste layer on one surface thereof in contact with the wiring electrode, and the protective layer may be provided on an opposite surface of the semiconductor light emitting element that is not in contact with the wiring electrode. The wiring electrode may have a surface roughness structure.

In an embodiment, forming the semiconductor light emitting element may include forming: a stacked structure including a first conductive semiconductor layer, an active layer, and a second conductive semiconductor layer; a first conductive electrode electrically connected to the first conductive semiconductor layer of the stacked structure; and a second conductive electrode electrically connected to the second conductive semiconductor layer of the stacked structure. Transferring the semiconductor light emitting element to the first temporary substrate may include bring the first conductive electrode and the second conductive electrode of the semiconductor light emitting element into contact with the first temporary substrate.

In an embodiment, transferring the semiconductor light emitting element to the second temporary substrate may include bring the second conductive semiconductor layer of the semiconductor light emitting element into contact with the protective layer of the second temporary substrate.

In an embodiment, the second temporary substrate may include: the protective layer; a release layer positioned below the protective layer; and a release laser reflective layer positioned below the release layer and selectively formed in a first region of the second temporary substrate.

In an embodiment, the second temporary substrate may include the first region which the semiconductor light emitting element is not transferred to and a second region which the semiconductor light emitting element is transferred to and located in, with respect to a horizontal direction of the second temporary substrate.

In an embodiment, transferring the semiconductor light emitting element to the wiring substrate may include: separating the protective layer of the second temporary substrate and the release layer of the second temporary substrate; and transferring the semiconductor light emitting element and the protective layer in contact with the semiconductor light emitting element to the wiring substrate by separating the semiconductor light emitting element and the protective layer from the second temporary substrate.

In an embodiment, separating the protective layer and the release layer may include: irradiating a ultraviolet (UV) light laser or a visible light laser to a rear surface of the second temporary substrate rather than a surface to which the semiconductor light emitting element is transferred; and deforming, by the irradiated laser, an interface shape of the release layer in the second region of the second temporary substrate in which the release laser reflective layer is not provided.

In an embodiment, the wiring electrode may be formed above an organic pad having a surface roughness structure, and the organic pad may include a plurality of nanoparticles and have a structure in which at least one nanoparticle among the plurality of nanoparticles is exposed on a surface of the organic pad.

In an embodiment, the first temporary substrate may include a protrusion. Transferring the semiconductor light emitting element to the first temporary substrate may include aligning the growth substrate and the first temporary substrate such that the semiconductor light emitting element overlaps with the protrusion.

In another aspect of the present disclosure, a display device based on a plurality of semiconductor light emitting elements is provided. The display device may include: a substrate; an organic pad having a surface roughness structure and positioned above the substrate; a wiring electrode positioned on the organic pad; an anisotropy conductive adhesive paste layer having conductive particles and positioned on the wiring electrode; a semiconductor light emitting element positioned on the anisotropy conductive adhesive paste layer and electrically connected to the wiring electrode by the conductive particles of the paste layer; and a protective layer not connected to the wiring electrode and provided on an upper surface of the semiconductor light emitting element. The organic pad may include a plurality of nanoparticles and have a structure in which at least one nanoparticle among the plurality of nanoparticles is exposed on a surface of the organic pad.

In an embodiment, the semiconductor light emitting element has a horizontal-type semiconductor light emitting structure including: a first conductive semiconductor layer; an active layer; a second conductive semiconductor layer; a first conductive electrode positioned on the first conductive semiconductor layer; and a second conductive electrode positioned in a region in which the second conductive semiconductor layer is exposed by partially etching the first conductive semiconductor layer and the active layer.

In an embodiment, the second conductive semiconductor layer of the semiconductor light emitting element may be in contact with the protective layer, and the first conductive electrode and the second conductive electrode of the semiconductor light emitting element may be in contact with the anisotropy conductive adhesive paste layer.

In an embodiment, the protective layer may be formed such that the protective layer protrudes more than at least one side of the second conductive semiconductor layer.

In an embodiment, the protective layer may be made of ultraviolet (UV) resin or thermosetting resin.

In an embodiment, a first refractive index of the protective layer may be smaller than a second refractive index of the semiconductor light emitting element.

In an embodiment, the first refractive index may have a refractive index between 1.5 and 2.3.

In an embodiment, the semiconductor light emitting element may be a light emitting diode (LED) with a size in micrometers (Micro-LED).

Advantageous Effects

According to an embodiment of the present disclosure, a display device based on a semiconductor light emitting element and manufacturing method thereof may be provided.

Specifically, the semiconductor light emitting element may be transferred to a wiring substrate, and an anisotropy conductive adhesive paste layer may be formed only in conductive electrodes of the semiconductor light emitting element and the periphery thereof. Therefore, when the semiconductor light emitting element is transferred to the location of a wiring electrode in the wiring substrate, wiring may be performed without the risk of a short circuit between elements.

In addition, the wiring electrode may have a surface roughness structure and an organic pad therebelow. Thus, when compressed with the anisotropy conductive adhesive paste layer, the surface roughness structure and the organic pad may increase a contact area with conductive particles in the paste layer and mitigate impacts caused by the compression. Accordingly, the semiconductor light emitting element may be stably transferred to the wiring electrode.

Furthermore, according to another embodiment of the present disclosure, there are additional effects not mentioned herein. Those of ordinary skill in the art may understand it through the full text of the specification and drawings.

BEST MODE

Reference will now be made in detail to embodiments of the present disclosure, examples of which are illustrated in the accompanying drawings. Wherever possible, the same reference numbers will be used throughout the drawings to refer to the same or like parts, and redundant description thereof will be omitted. As used herein, the suffixes "module" and "unit" are added or used interchangeably to facilitate preparation of this specification and are not intended to suggest distinct meanings or functions. In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification.

Furthermore, although the drawings are separately described for simplicity, embodiments implemented by combining at least two or more drawings are also within the scope of the present disclosure.

In addition, when an element such as a layer, region or module is described as being "on" another element, it is to be understood that the element may be directly on the other element or there may be an intermediate element between them.

The display device described herein is a concept including all display devices that display information with a unit pixel or a set of unit pixels. Therefore, the display device may be applied not only to finished products but also to parts. For example, a panel corresponding to a part of a digital TV also independently corresponds to the display device in the present specification. The finished products include a mobile phone, a smartphone, a laptop, a digital broadcasting terminal, a personal digital assistant (PDA), a portable multimedia player (PMP), a navigation system, a slate PC, a tablet, an Ultrabook, a digital TV, a desktop computer, and the like.

However, it will be readily apparent to those skilled in the art that the configuration according to the embodiments described herein is applicable even to a new product that will be developed later as a display device.

In addition, the semiconductor light emitting element mentioned in this specification is a concept including an LED, a micro LED, and the like.

Figure 1:
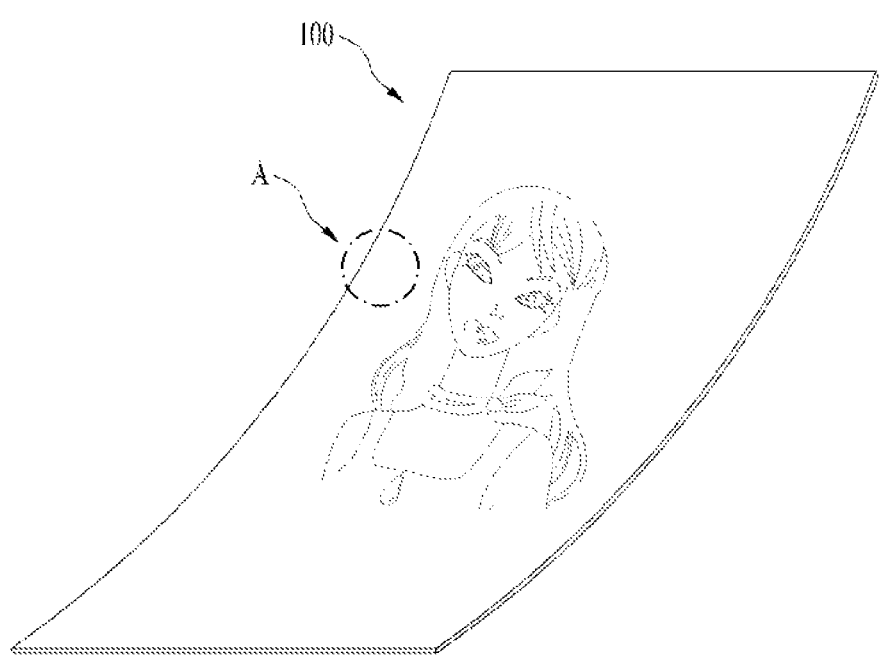
FIG. 1 is a conceptual diagram illustrating an embodiment of a display device using a semiconductor light emitting element according to the present disclosure.

FIG. 1 is a conceptual view illustrating an embodiment of a display device using a semiconductor light emitting element according to the present disclosure.

As shown in FIG. 1, information processed by a controller (not shown) of a display device 100 may be displayed using a flexible display.

The flexible display may include, for example, a display that can be warped, bent, twisted, folded, or rolled by external force.

Furthermore, the flexible display may be, for example, a display manufactured on a thin and flexible substrate that can be warped, bent, folded, or rolled like paper while maintaining the display characteristics of a conventional flat panel display.

When the flexible display remains in an unbent state (e.g., a state having an infinite radius of curvature) (hereinafter referred to as a first state), the display area of the flexible display forms a flat surface. When the display in the first sate is changed to a bent state (e.g., a state having a finite radius of curvature) (hereinafter referred to as a second state) by external force, the display area may be a curved surface. As shown in FIG. 1, the information displayed in the second state may be visual information output on a curved surface. Such visual information may be implemented by independently controlling the light emission of sub-pixels arranged in a matrix form. The unit pixel may mean, for example, a minimum unit for implementing one color.

The unit pixel of the flexible display may be implemented by a semiconductor light emitting element. In the present disclosure, a light emitting diode (LED) is exemplified as a type of the semiconductor light emitting element configured to convert electric current into light. The LED may be formed in a small size, and may thus serve as a unit pixel even in the second state.

Hereinafter, a flexible display implemented using the LED will be described in more detail with reference to the drawings.

Figure 2:
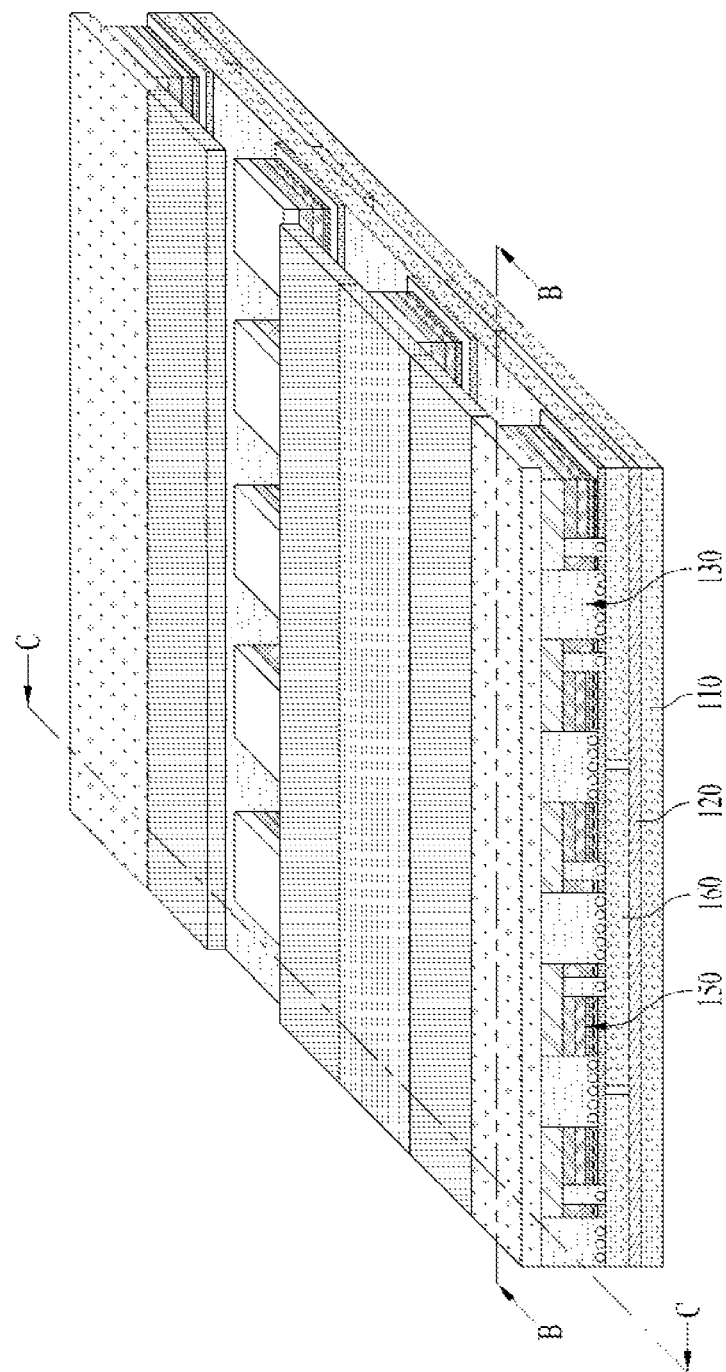
FIG. 2 is a partially enlarged diagram showing a part A shown in FIG. 1.

FIG. 2 is a partially enlarged view showing part A of FIG. 1.

Figure 3A:
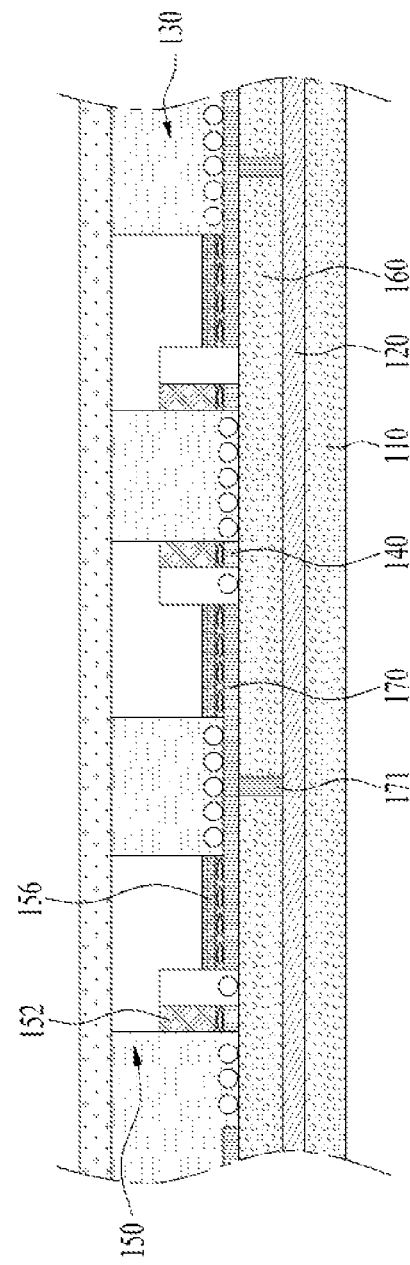
FIGS. 3A and 3B are cross-sectional diagrams taken along the cutting lines B-B and C-C in FIG. 2.
Figure 3B:
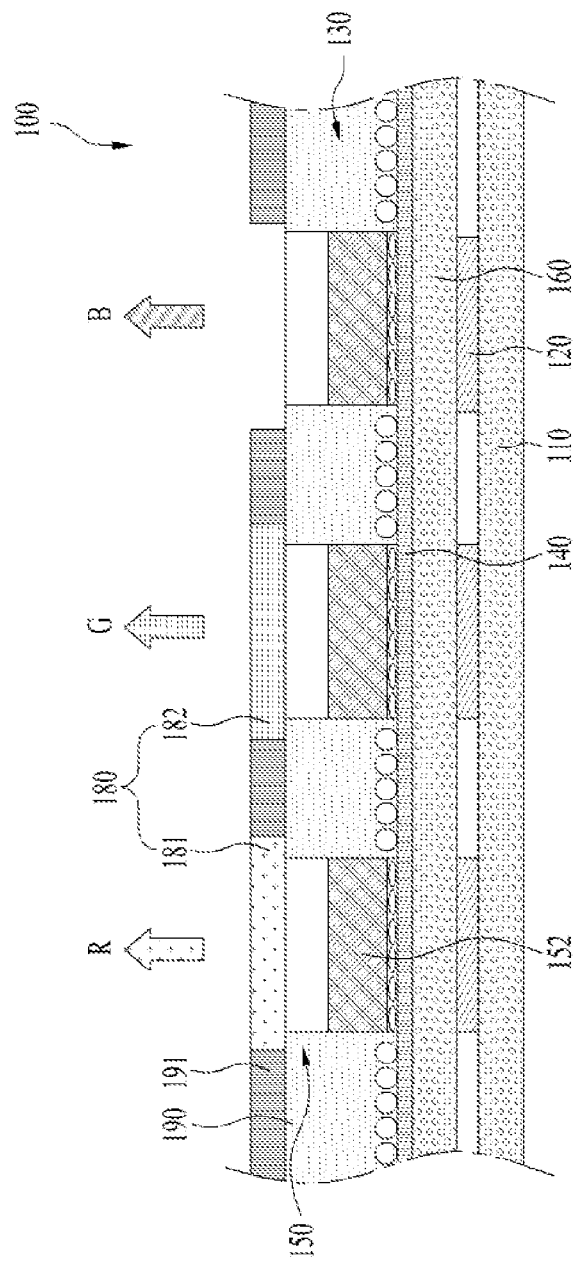

FIGS. 3A and 3B are cross-sectional views taken along lines B-B and C-C in FIG. 2.

Figure 4:
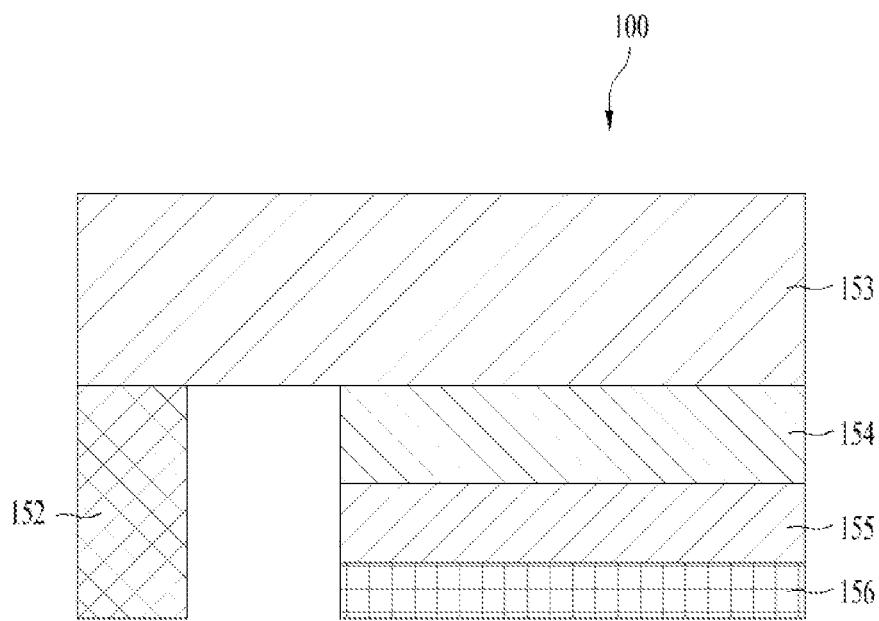
FIG. 4 is a conceptual diagram illustrating the flip-chip type semiconductor light emitting element of FIG. 3.

FIG. 4 is a conceptual view illustrating the flip-chip type semiconductor light emitting element of FIG. 3.

Figure 5A:
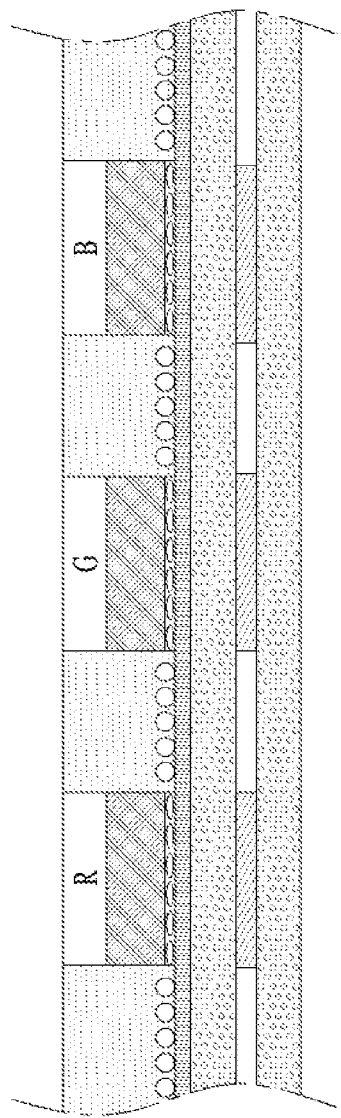
FIGS. 5A to 5C are conceptual diagrams illustrating various examples of color implementation with respect to a flip-chip type semiconductor light emitting element.
Figure 5B:
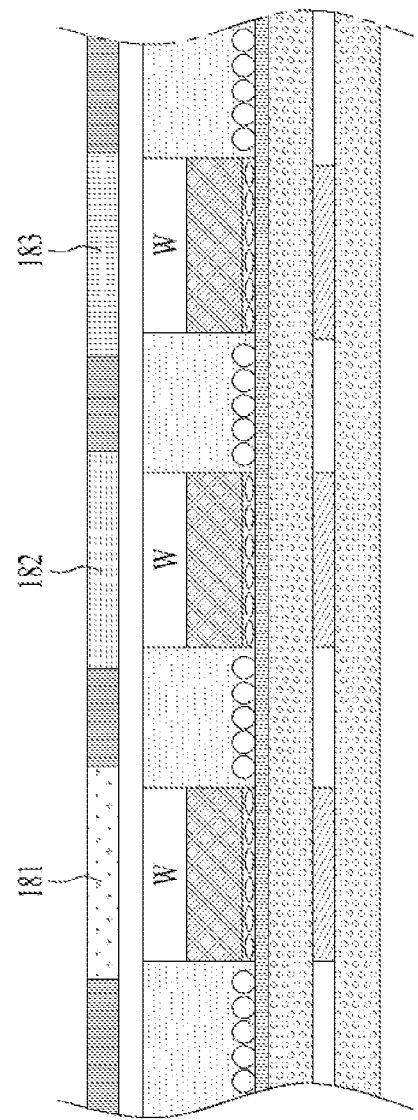
Figure 5C:
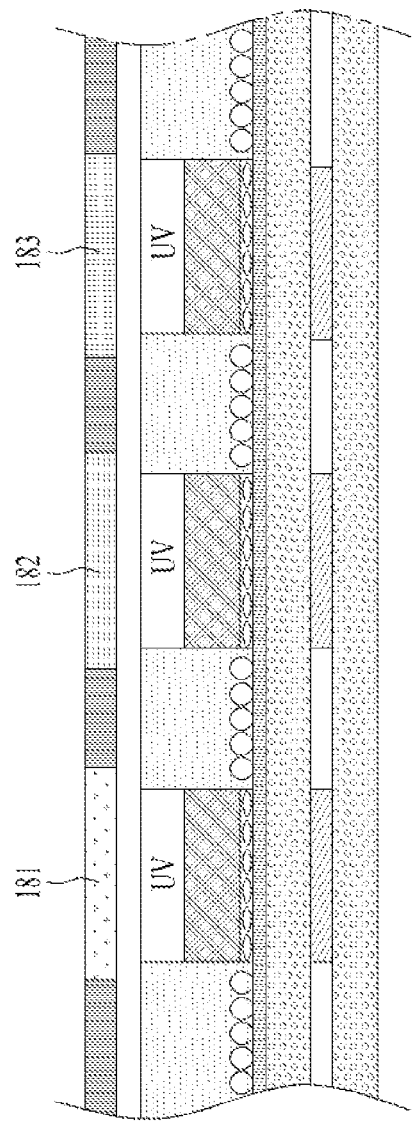

FIGS. 5A to 5C are conceptual views illustrating various examples of implementation of colors in relation to a flip-chip type semiconductor light emitting element.

As shown in FIGS. 2, 3A and 3B, the display device 100 using a passive matrix (PM) type semiconductor light emitting element is exemplified as the display device 100 using a semiconductor light emitting element. However, the examples described below are also applicable to an active matrix (AM) type semiconductor light emitting element.

The display device 100 shown in FIG. 1 may include a substrate 110, a first electrode 120, a conductive adhesive layer 130, a second electrode 140, and at least one semiconductor light emitting element 150, as shown in FIG. 2.

The substrate 110 may be a flexible substrate. For example, to implement a flexible display device, the substrate 110 may include glass or polyimide (PI). Any insulative and flexible material such as polyethylene naphthalate (PEN) or polyethylene terephthalate (PET) may be employed. In addition, the substrate 110 may be formed of either a transparent material or an opaque material.

The substrate 110 may be a wiring substrate on which the first electrode 120 is disposed. Thus, the first electrode 120 may be positioned on the substrate 110.

As shown in FIG. 3A, an insulating layer 160 may be disposed on the substrate 110 on which the first electrode 120 is positioned, and an auxiliary electrode 170 may be positioned on the insulating layer 160. In this case, a stack in which the insulating layer 160 is laminated on the substrate 110 may be a single wiring substrate. More specifically, the insulating layer 160 may be formed of an insulative and flexible material such as PI, PET, or PEN, and may be integrated with the substrate 110 to form a single substrate.

The auxiliary electrode 170, which is an electrode that electrically connects the first electrode 120 and the semiconductor light emitting element 150, is positioned on the insulating layer 160, and is disposed to correspond to the position of the first electrode 120. For example, the auxiliary electrode 170 may have a dot shape and may be electrically connected to the first electrode 120 by an electrode hole 171 formed through the insulating layer 160. The electrode hole 171 may be formed by filling a via hole with a conductive material.

As shown in FIG. 2 or 3A, a conductive adhesive layer 130 may be formed on one surface of the insulating layer 160, but embodiments of the present disclosure are not limited thereto. For example, a layer performing a specific function may be formed between the insulating layer 160 and the conductive adhesive layer 130, or the conductive adhesive layer 130 may be disposed on the substrate 110 without the insulating layer 160. In a structure in which the conductive adhesive layer 130 is disposed on the substrate 110, the conductive adhesive layer 130 may serve as an insulating layer.

The conductive adhesive layer 130 may be a layer having adhesiveness and conductivity. For this purpose, a material having conductivity and a material having adhesiveness may be mixed in the conductive adhesive layer 130. In addition, the conductive adhesive layer 130 may have ductility, thereby providing making the display device flexible.

As an example, the conductive adhesive layer 130 may be an anisotropic conductive film (ACF), an anisotropic conductive paste, a solution containing conductive particles, or the like. The conductive adhesive layer 130 may be configured as a layer that allows electrical interconnection in the direction of the Z-axis extending through the thickness, but is electrically insulative in the horizontal X-Y direction. Accordingly, the conductive adhesive layer 130 may be referred to as a Z-axis conductive layer (hereinafter, referred to simply as a "conductive adhesive layer").

The ACF is a film in which an anisotropic conductive medium is mixed with an insulating base member. When the ACF is subjected to heat and pressure, only a specific portion thereof becomes conductive by the anisotropic conductive medium. Hereinafter, it will be described that heat and pressure are applied to the ACF. However, another method may be used to make the ACF partially conductive. The other method may be, for example, application of only one of the heat and pressure or UV curing.

In addition, the anisotropic conductive medium may be, for example, conductive balls or conductive particles. For example, the ACF may be a film in which conductive balls are mixed with an insulating base member. Thus, when heat and pressure are applied to the ACF, only a specific portion of the ACF is allowed to be conductive by the conductive balls. The ACF may contain a plurality of particles formed by coating the core of a conductive material with an insulating film made of a polymer material. In this case, as the insulating film is destroyed in a portion to which heat and pressure are applied, the portion is made to be conductive by the core. At this time, the cores may be deformed to form layers that contact each other in the thickness direction of the film. As a more specific example, heat and pressure are applied to the whole ACF, and an electrical connection in the Z-axis direction is partially formed by the height difference of a counterpart adhered by the ACF.

As another example, the ACF may contain a plurality of particles formed by coating an insulating core with a conductive material. In this case, as the conductive material is deformed (pressed) in a portion to which heat and pressure are applied, the portion is made to be conductive in the thickness direction of the film. As another example, the conductive material may be disposed through the insulating base member in the Z-axis direction to provide conductivity in the thickness direction of the film. In this case, the conductive material may have a pointed end.

The ACF may be a fixed array ACF in which conductive balls are inserted into one surface of the insulating base member. More specifically, the insulating base member may be formed of an adhesive material, and the conductive balls may be intensively disposed on the bottom portion of the insulating base member. Thus, when the base member is subjected to heat and pressure, it may be deformed together with the conductive balls, exhibiting conductivity in the vertical direction.

However, the present disclosure is not necessarily limited thereto, and the ACF may be formed by randomly mixing conductive balls in the insulating base member, or may be composed of a plurality of layers with conductive balls arranged on one of the layers (as a double-ACF).

The anisotropic conductive paste may be a combination of a paste and conductive balls, and may be a paste in which conductive balls are mixed with an insulating and adhesive base material. Also, the solution containing conductive particles may be a solution containing any conductive particles or nanoparticles.

Referring back to FIG. 3A, the second electrode 140 is positioned on the insulating layer 160 and spaced apart from the auxiliary electrode 170. That is, the conductive adhesive layer 130 is disposed on the insulating layer 160 having the auxiliary electrode 170 and the second electrode 140 positioned thereon.

After the conductive adhesive layer 130 is formed with the auxiliary electrode 170 and the second electrode 140 positioned on the insulating layer 160, the semiconductor light emitting element 150 is connected thereto in a flip-chip form by applying heat and pressure. Thereby, the semiconductor light emitting element 150 is electrically connected to the first electrode 120 and the second electrode 140.

Referring to FIG. 4, the semiconductor light emitting element may be a flip chip-type light emitting device.

For example, the semiconductor light emitting element may include a p-type electrode 156, a p-type semiconductor layer 155 on which the p-type electrode 156 is formed, an active layer 154 formed on the p-type semiconductor layer 155, an n-type semiconductor layer 153 formed on the active layer 154, and an n-type electrode 152 disposed on the n-type semiconductor layer 153 and horizontally spaced apart from the p-type electrode 156. In this case, the p-type electrode 156 may be electrically connected to the auxiliary electrode 170, which is shown in FIG. 3, by the conductive adhesive layer 130, and the n-type electrode 152 may be electrically connected to the second electrode 140.

Referring back to FIGS. 2, 3A and 3B, the auxiliary electrode 170 may be elongated in one direction. Thus, one auxiliary electrode may be electrically connected to the plurality of semiconductor light emitting elements 150. For example, p-type electrodes of semiconductor light emitting elements on left and right sides of an auxiliary electrode may be electrically connected to one auxiliary electrode.

More specifically, the semiconductor light emitting element 150 may be press-fitted into the conductive adhesive layer 130 by heat and pressure. Thereby, only the portions of the semiconductor light emitting element 150 between the p-type electrode 156 and the auxiliary electrode 170 and between the n-type electrode 152 and the second electrode 140 may exhibit conductivity, and the other portions of the semiconductor light emitting element 150 do not exhibit conductivity as they are not press-fitted. In this way, the conductive adhesive layer 130 interconnects and electrically connects the semiconductor light emitting element 150 and the auxiliary electrode 170 and interconnects and electrically connects the semiconductor light emitting element 150 and the second electrode 140.

The plurality of semiconductor light emitting elements 150 may constitute a light emitting device array, and a phosphor conversion layer 180 may be formed on the light emitting device array.

The light emitting device array may include a plurality of semiconductor light emitting elements having different luminance values. Each semiconductor light emitting element 150 may constitute a unit pixel and may be electrically connected to the first electrode 120. For example, a plurality of first electrodes 120 may be provided, and the semiconductor light emitting elements may be arranged in, for example, several columns. The semiconductor light emitting elements in each column may be electrically connected to any one of the plurality of first electrodes.

In addition, since the semiconductor light emitting elements are connected in a flip-chip form, semiconductor light emitting elements grown on a transparent dielectric substrate may be used. The semiconductor light emitting elements may be, for example, nitride semiconductor light emitting elements. Since the semiconductor light emitting element 150 has excellent luminance, it may constitute an individual unit pixel even when it has a small size.

As shown in FIG. 3, a partition wall 190 may be formed between the semiconductor light emitting elements 150. In this case, the partition wall 190 may serve to separate individual unit pixels from each other, and may be integrated with the conductive adhesive layer 130. For example, by inserting the semiconductor light emitting element 150 into the ACF, the base member of the ACF may form the partition wall.

In addition, when the base member of the ACF is black, the partition wall 190 may have reflectance and increase contrast even without a separate black insulator.

As another example, a reflective partition wall may be separately provided as the partition wall 190. In this case, the partition wall 190 may include a black or white insulator depending on the purpose of the display device. When a partition wall including a white insulator is used, reflectivity may be increased. When a partition wall including a black insulator is used, it may have reflectance and increase contrast.

The phosphor conversion layer 180 may be positioned on the outer surface of the semiconductor light emitting element 150. For example, the semiconductor light emitting element 150 may be a blue semiconductor light emitting element that emits blue (B) light, and the phosphor conversion layer 180 may function to convert the blue (B) light into a color of a unit pixel. The phosphor conversion layer 180 may be a red phosphor 181 or a green phosphor 182 constituting an individual pixel.

That is, the red phosphor 181 capable of converting blue light into red (R) light may be laminated on a blue semiconductor light emitting element at a position of a unit pixel of red color, and the green phosphor 182 capable of converting blue light into green (G) light may be laminated on the blue semiconductor light emitting element at a position of a unit pixel of green color. Only the blue semiconductor light emitting element may be used alone in the portion constituting the unit pixel of blue color. In this case, unit pixels of red (R), green (G), and blue (B) may constitute one pixel. More specifically, a phosphor of one color may be laminated along each line of the first electrode 120. Accordingly, one line on the first electrode 120 may be an electrode for controlling one color. That is, red (R), green (G), and blue (B) may be sequentially disposed along the second electrode 140, thereby implementing a unit pixel.

However, embodiments of the present disclosure are not limited thereto. Unit pixels of red (R), green (G), and blue (B) may be implemented by combining the semiconductor light emitting element 150 and the quantum dot (QD) rather than using the phosphor.

Also, a black matrix 191 may be disposed between the phosphor conversion layers to improve contrast. That is, the black matrix 191 may improve contrast of light and darkness.

However, embodiments of the present disclosure are not limited thereto, and anther structure may be applied to implement blue, red, and green colors.

Referring to FIG. 5A, each semiconductor light emitting element may be implemented as a high-power light emitting device emitting light of various colors including blue by using gallium nitride (GaN) as a main material and adding indium (In) and/or aluminum (Al).

In this case, each semiconductor light emitting element may be a red, green, or blue semiconductor light emitting element to form a unit pixel (sub-pixel). For example, red, green, and blue semiconductor light emitting elements R, G, and B may be alternately disposed, and unit pixels of red, green, and blue may constitute one pixel by the red, green and blue semiconductor light emitting elements. Thereby, a full-color display may be implemented.

Referring to FIG. 5B, the semiconductor light emitting element 150a may include a white light emitting device W having a yellow phosphor conversion layer, which is provided for each device. In this case, in order to form a unit pixel, a red phosphor conversion layer 181, a green phosphor conversion layer 182, and a blue phosphor conversion layer 183 may be disposed on the white light emitting device W. In addition, a unit pixel may be formed using a color filter repeating red, green, and blue on the white light emitting device W.

Referring to FIG. 5C, a red phosphor conversion layer 181, a green phosphor conversion layer 185, and a blue phosphor conversion layer 183 may be provided on a ultraviolet light emitting device. Not only visible light but also ultraviolet (UV) light may be used in the entire region of the semiconductor light emitting element. In an embodiment, UV may be used as an excitation source of the upper phosphor in the semiconductor light emitting element.

Referring back to this example, the semiconductor light emitting element is positioned on the conductive adhesive layer to constitute a unit pixel in the display device. Since the semiconductor light emitting element has excellent luminance, individual unit pixels may be configured despite even when the semiconductor light emitting element has a small size.

Regarding the size of such an individual semiconductor light emitting element, the length of each side of the device may be, for example, 80 μm or less, and the device may have a rectangular or square shape. When the semiconductor light emitting element has a rectangular shape, the size thereof may be less than or equal to 20 μm×80 μm.

In addition, even when a square semiconductor light emitting element having a side length of 10 μm is used as a unit pixel, sufficient brightness to form a display device may be obtained.

Therefore, for example, in case of a rectangular pixel having a unit pixel size of 600 μm×300 μm (i.e., one side by the other side), a distance of a semiconductor light emitting element becomes sufficiently long relatively.

Thus, in this case, it is able to implement a flexible display device having high image quality over HD image quality.

The above-described display device using the semiconductor light emitting element may be prepared by a new fabricating method. Such a fabricating method will be described with reference to FIG. 6 as follows.

Figure 6:
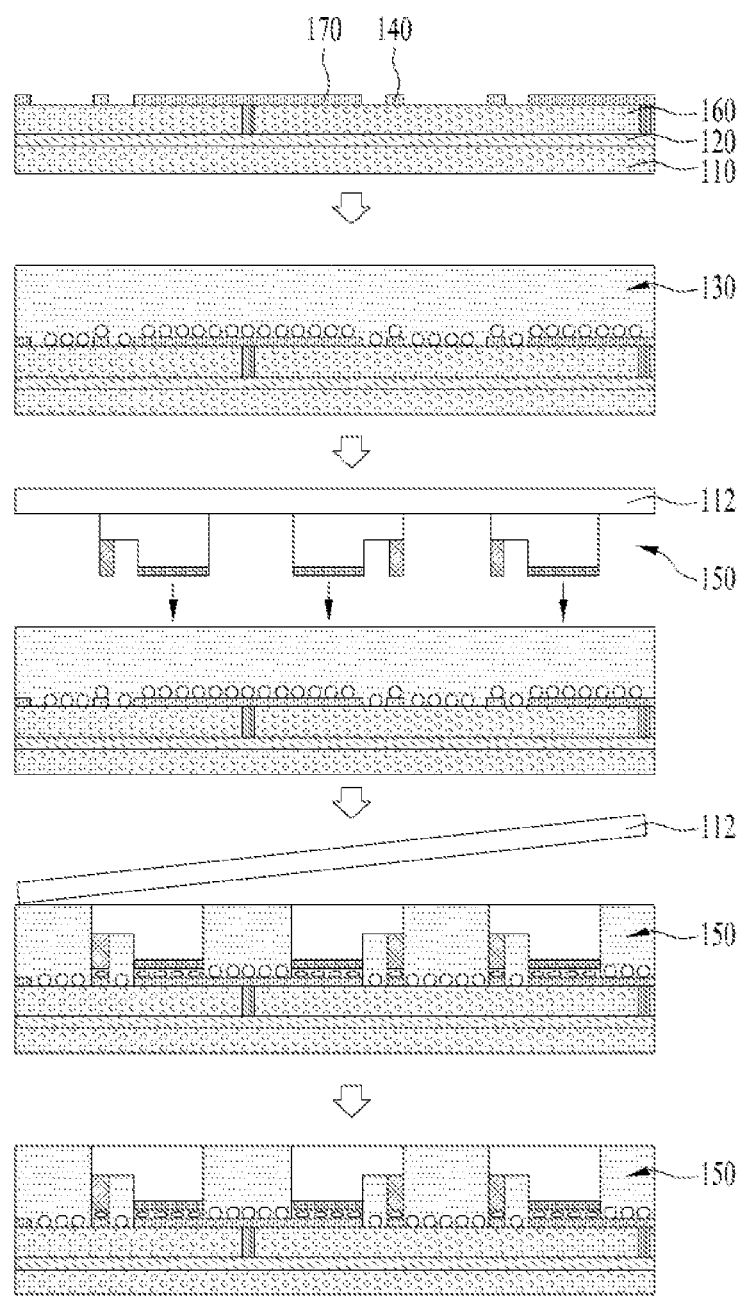
FIG. 6 shows cross-sectional views of a method of fabricating a display device using a semiconductor light emitting element according to the present disclosure.

FIG. 6 shows cross-sectional views of a method of fabricating a display device using a semiconductor light emitting element according to the present disclosure.

Referring to FIG. 6, first of all, a conductive adhesive layer 130 is formed on an insulating layer 160 located between an auxiliary electrode 170 and a second electrode 140. The insulating layer 160 is tacked on a wiring substrate 110. On the wiring substrate 110, a first electrode 120, the auxiliary electrode 170 and the second electrode 140 are disposed. In this case, the first electrode 120 and the second electrode 140 may be disposed in mutually orthogonal directions, respectively. In order to implement a flexible display device, the wiring substrate 110 and the insulating layer 160 may include glass or polyimide (PI) each.

For example, the conductive adhesive layer 130 may be implemented by an anisotropic conductive film. To this end, an anisotropic conductive film may be coated on the substrate on which the insulating layer 160 is located.

Subsequently, a temporary substrate 112, on which a plurality of semiconductor light emitting elements 150 configuring individual pixels are located to correspond to locations of the auxiliary electrode 170 and the second electrodes 140, is disposed in a manner that the semiconductor light emitting element 150 confronts the auxiliary electrode 170 and the second electrode 140.

In this regard, the temporary 112 substrate 112 is a growing substrate for growing the semiconductor light emitting element 150 and may include a sapphire or silicon substrate.

The semiconductor light emitting element is configured to have a space and size for configuring a display device when formed in unit of wafer, thereby being effectively used for the display device.

Subsequently, the wiring substrate 110 and the temporary substrate 112 are thermally compressed together. By the thermocompression, the wiring substrate 110 and the temporary substrate 112 are bonded together. Owing to the property of an anisotropic conductive film having conductivity by thermocompression, only a portion among the semiconductor light emitting element 150, the auxiliary electrode 170 and the second electrode 140 has conductivity, via which the electrodes and the semiconductor light emitting element 150 may be connected electrically. In this case, the semiconductor light emitting element 150 is inserted into the anisotropic conductive film, by which a partition may be formed between the semiconductor light emitting elements 150.

Then the temporary substrate 112 is removed. For example, the temporary substrate 112 may be removed using Laser Lift-Off (LLO) or Chemical Lift-Off (CLO).

Finally, by removing the temporary substrate 112, the semiconductor light emitting elements 150 exposed externally. If necessary, the wiring substrate 110 to which the semiconductor light emitting elements 150 are coupled may be coated with silicon oxide (SiOx) or the like to form a transparent insulating layer (not shown).

In addition, a step of forming a phosphor layer on one side of the semiconductor light emitting element 150 may be further included. For example, the semiconductor light emitting element 150 may include a blue semiconductor light emitting element emitting Blue (B) light, and a red or green phosphor for converting the blue (B) light into a color of a unit pixel may form a layer on one side of the blue semiconductor light emitting element.

The above-described fabricating method or structure of the display device using the semiconductor light emitting element may be modified into various forms. For example, the above-described display device may employ a vertical semiconductor light emitting element.

Furthermore, a modification or embodiment described in the following may use the same or similar reference numbers for the same or similar configurations of the former example and the former description may apply thereto.

Figure 7:
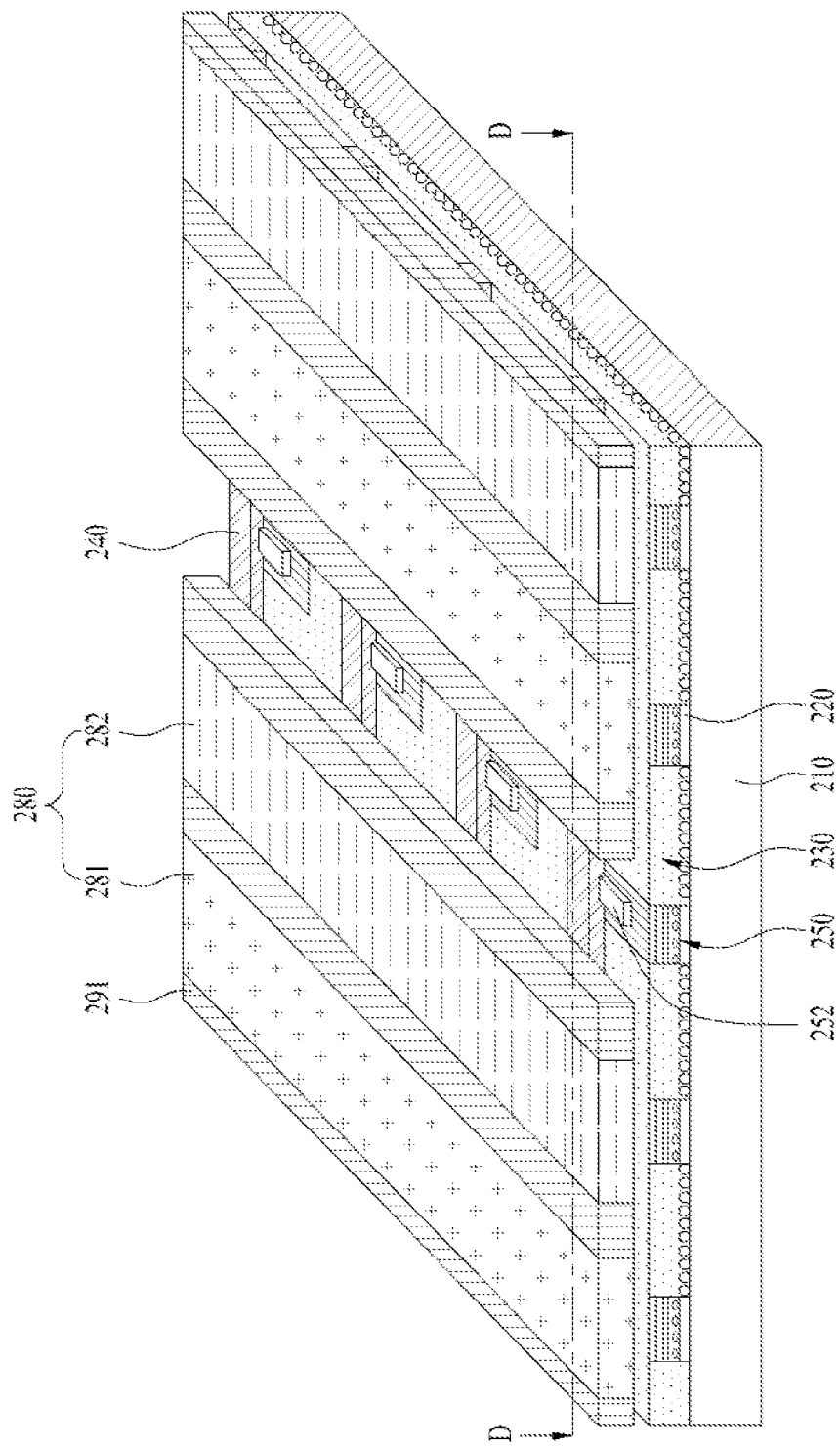
FIG. 7 is a perspective diagram of a display device using a semiconductor light emitting element according to another embodiment of the present disclosure.
Figure 8:
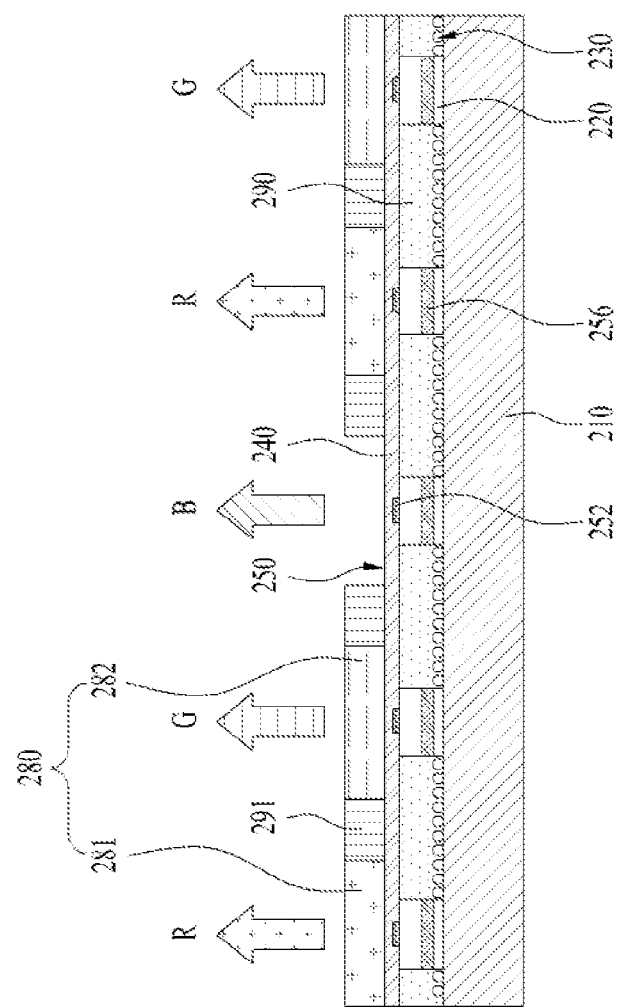
FIG. 8 is a cross-sectional diagram taken along a cutting line D-D shown in FIG. 8.
Figure 9:
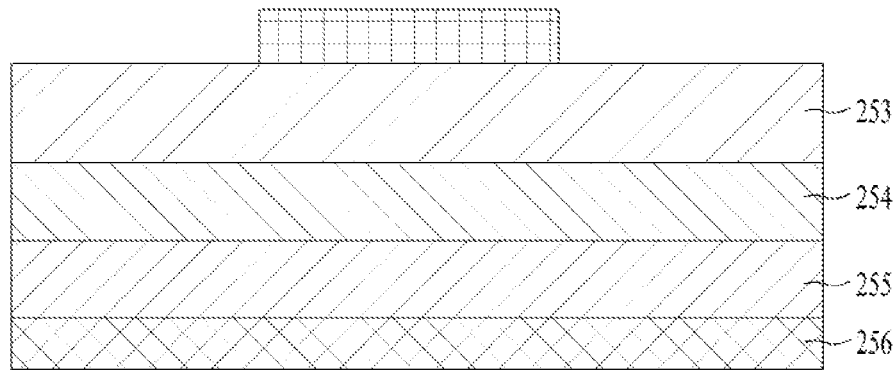
FIG. 9 is a conceptual diagram showing a vertical type semiconductor light emitting element shown in FIG. 8.

FIG. 7 is a perspective diagram of a display device using a semiconductor light emitting element according to another embodiment of the present disclosure, FIG. 8 is a cross-sectional diagram taken along a cutting line D-D shown in FIG. 8, and FIG. 9 is a conceptual diagram showing a vertical type semiconductor light emitting element shown in FIG. 8.

Referring to the present drawings, a display device may employ a vertical semiconductor light emitting device of a Passive Matrix (PM) type.

The display device includes a substrate 210, a first electrode 220, a conductive adhesive layer 230, a second electrode 240 and at least one semiconductor light emitting element 250.

The substrate 210 is a wiring substrate on which the first electrode 220 is disposed and may contain polyimide (PI) to implement a flexible display device. Besides, the substrate 210 may use any substance that is insulating and flexible.

The first electrode 210 is located on the substrate 210 and may be formed as a bar type electrode that is long in one direction. The first electrode 220 may be configured to play a role as a data electrode.

The conductive adhesive layer 230 is formed on the substrate 210 where the first electrode 220 is located. Like a display device to which a light emitting device of a flip chip type is applied, the conductive adhesive layer 230 may include one of an Anisotropic Conductive Film (ACF), an anisotropic conductive paste, a conductive particle contained solution and the like. Yet, in the present embodiment, a case of implementing the conductive adhesive layer 230 with the anisotropic conductive film is exemplified.

After the conductive adhesive layer has been placed in the state that the first electrode 220 is located on the substrate 210, if the semiconductor light emitting element 250 is connected by applying heat and pressure thereto, the semiconductor light emitting element 250 is electrically connected to the first electrode 220. In doing so, the semiconductor light emitting element 250 is preferably disposed to be located on the first electrode 220.

If heat and pressure is applied to an anisotropic conductive film, as described above, since the anisotropic conductive film has conductivity partially in a thickness direction, the electrical connection is established. Therefore, the anisotropic conductive film is partitioned into a conductive portion and a non-conductive portion.

Furthermore, since the anisotropic conductive film contains an adhesive component, the conductive adhesive layer 230 implements mechanical coupling between the semiconductor light emitting element 250 and the first electrode 220 as well as mechanical connection.

Thus, the semiconductor light emitting element 250 is located on the conductive adhesive layer 230, via which an individual pixel is configured in the display device. As the semiconductor light emitting element 250 has excellent luminance, an individual unit pixel may be configured in small size as well. Regarding a size of the individual semiconductor light emitting element 250, a length of one side may be equal to or smaller than 80 μm for example and the individual semiconductor light emitting element 250 may include a rectangular or square element. For example, the rectangular element may have a size equal to or smaller than 20 μm×80 μm.

The semiconductor light emitting element 250 may have a vertical structure.

Among the vertical type semiconductor light emitting elements, a plurality of second electrodes 240 respectively and electrically connected to the vertical type semiconductor light emitting elements 250 are located in a manner of being disposed in a direction crossing with a length direction of the first electrode 220.

Referring to FIG. 9, the vertical type semiconductor light emitting element 250 includes a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on then-type semiconductor layer 253. In this case, the p-type electrode 256 located on a bottom side may be electrically connected to the first electrode 220 by the conductive adhesive layer 230, and the n-type electrode 252 located on a top side may be electrically connected to a second electrode 240 described later. Since such a vertical type semiconductor light emitting element 250 can dispose the electrodes at top and bottom, it is considerably advantageous in reducing a chip size.

Referring to FIG. 8 again, a phosphor layer 280 may formed on one side of the semiconductor light emitting element 250. For example, the semiconductor light emitting element 250 may include a blue semiconductor light emitting element 251 emitting blue (B) light, and a phosphor layer 280 for converting the blue (B) light into a color of a unit pixel may be provided. In this regard, the phosphor layer 280 may include a red phosphor 281 and a green phosphor 282 configuring an individual pixel.

Namely, at a location of configuring a red unit pixel, the red phosphor 281 capable of converting blue light into red (R) light may be stacked on a blue semiconductor light emitting element. At a location of configuring a green unit pixel, the green phosphor 282 capable of converting blue light into green (G) light may be stacked on the blue semiconductor light emitting element. Moreover, the blue semiconductor light emitting element may be singly usable for a portion that configures a blue unit pixel. In this case, the unit pixels of red (R), green (G) and blue (B) may configure a single pixel.

Yet, the present disclosure is non-limited by the above description. In a display device to which a light emitting element of a flip chip type is applied, as described above, a different structure for implementing blue, red and green may be applicable.

Regarding the present embodiment again, the second electrode 240 is located between the semiconductor light emitting elements 250 and connected to the semiconductor light emitting elements electrically. For example, the semiconductor light emitting elements 250 are disposed in a plurality of columns, and the second electrode 240 may be located between the columns of the semiconductor light emitting elements 250.

Since a distance between the semiconductor light emitting elements 250 configuring the individual pixel is sufficiently long, the second electrode 240 may be located between the semiconductor light emitting elements 250.

The second electrode 240 may be formed as an electrode of a bar type that is long in one direction and disposed in a direction vertical to the first electrode.

In addition, the second electrode 240 and the semiconductor light emitting element 250 may be electrically connected to each other by a connecting electrode protruding from the second electrode 240. Particularly, the connecting electrode may include a n-type electrode of the semiconductor light emitting element 250. For example, the n-type electrode is formed as an ohmic electrode for ohmic contact, and the second electrode covers at least one portion of the ohmic electrode by printing or deposition. Thus, the second electrode 240 and the n-type electrode of the semiconductor light emitting element 250 may be electrically connected to each other.

Referring to FIG. 8 again, the second electrode 240 may be located on the conductive adhesive layer 230. In some cases, a transparent insulating layer (not shown) containing silicon oxide (SiOx) and the like may be formed on the substrate 210 having the semiconductor light emitting element 250 formed thereon. If the second electrode 240 is placed after the transparent insulating layer has been formed, the second electrode 240 is located on the transparent insulating layer. Alternatively, the second electrode 240 may be formed in a manner of being spaced apart from the conductive adhesive layer 230 or the transparent insulating layer.

If a transparent electrode of Indium Tin Oxide (ITO) or the like is sued to place the second electrode 240 on the semiconductor light emitting element 250, there is a problem that ITO substance has poor adhesiveness to an n-type semiconductor layer. Therefore, according to the present disclosure, as the second electrode 240 is placed between the semiconductor light emitting elements 250, it is advantageous in that a transparent electrode of ITO is not used. Thus, light extraction efficiency can be improved using a conductive substance having good adhesiveness to an n-type semiconductor layer as a horizontal electrode without restriction on transparent substance selection.

Referring to FIG. 8 again, a partition 290 may be located between the semiconductor light emitting elements 250.

Namely, in order to isolate the semiconductor light emitting element 250 configuring the individual pixel, the partition 290 may be disposed between the vertical type semiconductor light emitting elements 250. In this case, the partition 290 may play a role in separating the individual unit pixels from each other and be formed with the conductive adhesive layer 230 as an integral part. For example, by inserting the semiconductor light emitting element 250 in an anisotropic conductive film, a base member of the anisotropic conductive film may form the partition.

In addition, if the base member of the anisotropic conductive film is black, the partition 290 may have reflective property as well as a contrast ratio may be increased, without a separate block insulator.

For another example, a reflective partition may be separately provided as the partition 190. The partition 290 may include a black or white insulator depending on the purpose of the display device.

In case that the second electrode 240 is located right onto the conductive adhesive layer 230 between the semiconductor light emitting elements 250, the partition 290 may be located between the vertical type semiconductor light emitting element 250 and the second electrode 240 each. Therefore, an individual unit pixel may be configured using the semiconductor light emitting element 250. Since a distance between the semiconductor light emitting elements 250 is sufficiently long, the second electrode 240 can be placed between the semiconductor light emitting elements 250. And, it may bring an effect of implementing a flexible display device having HD image quality.

In addition, as shown in FIG. 8, a black matrix 291 may be disposed between the respective phosphors for the contrast ratio improvement. Namely, the black matrix 291 may improve the contrast between light and shade.

For a large screen high pixel display device based on semiconductor light emitting elements, the semiconductor light emitting elements grown on a growth substrate need to be assembled or transferred to a new substrate as described above. The growth substrate may be, for example, an 8-inch wafer, and thus transferring may be repeated multiple times.

For example, the assembly or transfer process may be a process in which a very large number of semiconductor light emitting elements are arranged on a new substrate all at once. However, during the arrangement process, the semiconductor light emitting elements may be arranged at positions different from determined positions so that arrangement errors may occur.

After the assembling or transferring, a wiring process for electrically connecting the semiconductor light emitting elements may be performed. When the range of the arrangement errors exceeds a certain specification range, the semiconductor light emitting elements may cause a short or open defect.

Therefore, to minimize the risk of defects in the wiring process and transfer the elements stably, a display device in which an anisotropy conductive adhesive paste (ACP) layer is selectively formed only in a semiconductor light emitting element region and manufacturing method thereof will be described with reference to FIGS. 10 to 23.

Figure 10:
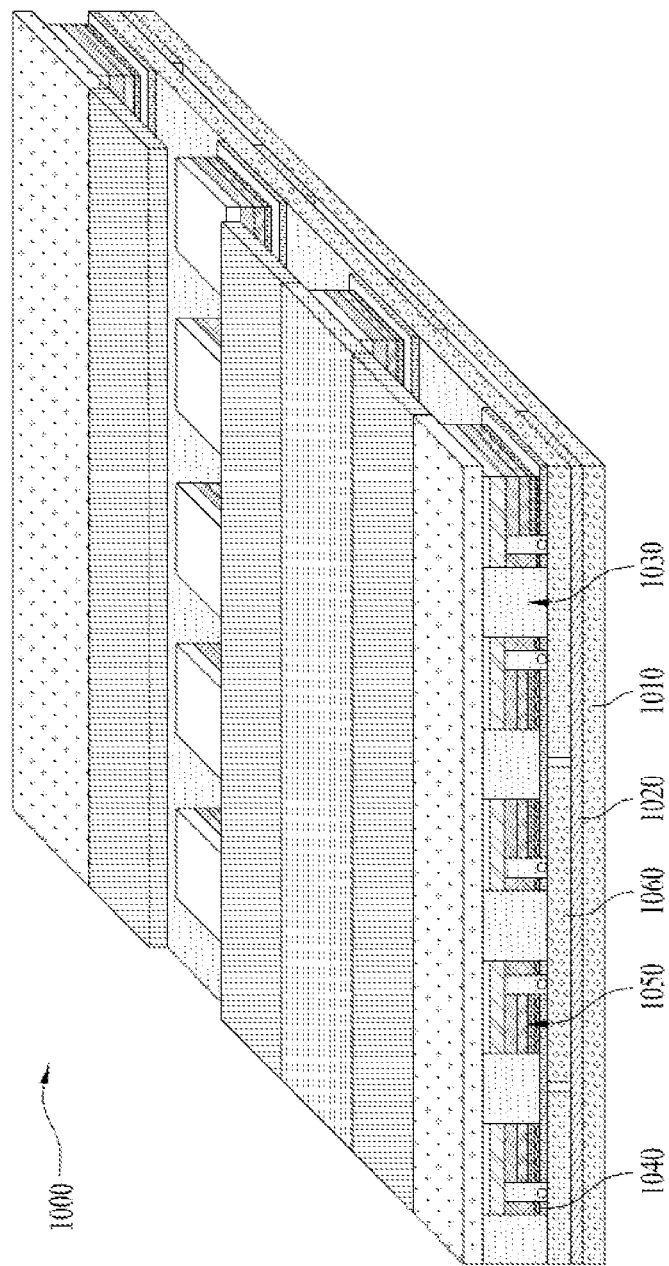
FIG. 10 is an enlarged view of part A of FIG. 1 for explaining a display device based on a semiconductor light emitting element according to another embodiment of the present disclosure.

In FIG. 10, a display device 1000 based on a passive matrix (PM) semiconductor light emitting element 1050 with a flip-chip structure is illustrated as the display device based on semiconductor light emitting elements. However, the following examples are also applicable to an active matrix (AM) semiconductor light emitting element. In addition, since the technical features of the semiconductor light emitting element 1050 are based on an ACP layer selectively formed on the electrode part of the element and the periphery thereof and a wiring electrode having an irregular surface roughness structure, the flip-chip structure is merely an example, and thus, the present disclosure is not limited thereto.

The display device 1000 may include a wiring substrate 1010, a first electrode 1020, an insulating layer 1030, a second electrode 1040, and a plurality of semiconductor light emitting elements 1050. Here, each of the first electrode 1020 and second electrode 1040 may include a plurality of electrode lines.

The wiring substrate 1010 may include polyimide (PI) to implement a flexible display device. In addition, any material may be used as long as it has insulation and flexibility.

The first electrode 1020 and second electrode 1040 may be disposed on the wiring substrate 1010 and electrically connected to conductive electrodes of the semiconductor light emitting elements 1050.

A plurality of second electrodes 1040 may be disposed between the semiconductor light emitting elements 1050 in a direction crossing the length direction of the first electrode 1020 and electrically connected to the semiconductor light emitting elements 1050.

As shown in FIG. 10, the semiconductor light emitting elements 1050 may form a plurality of columns in a direction parallel to a plurality of electrode lines provided in the first electrode 1020. However, the present disclosure is not limited thereto. For example, the semiconductor light emitting elements 1050 may form a plurality of columns along the second electrode 1040.

Figure 11:
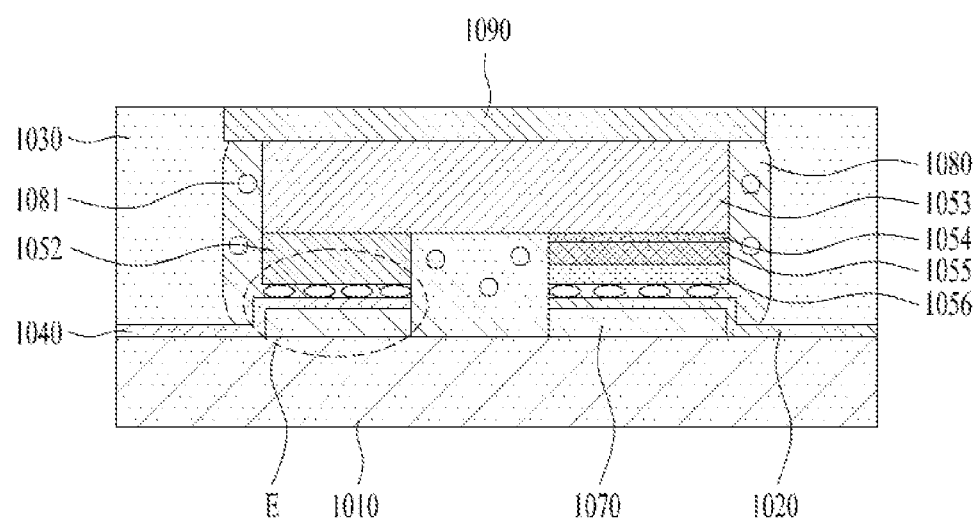
FIG. 11 is a view illustrating the semiconductor light emitting element of FIG. 10 which is connected to a wiring electrode.

FIG. 11 is a view illustrating the semiconductor light emitting element of FIG. 10 and the wiring electrode connected to the semiconductor light emitting element.

The semiconductor light emitting element 1050 may include a first conductive semiconductor layer 1055, an active layer 1054, and a second conductive semiconductor layer 1053.

The semiconductor light emitting element 1050 may further include a first conductive electrode 1056 electrically connected to the first conductive semiconductor layer 1055 and a second conductive electrode 1052 electrically connected to the second conductive semiconductor layer 1053.

A protective layer 1090 may be positioned on the upper surface of the second conductive semiconductor layer 1053 of the semiconductor light emitting element. The protective layer 1090 is a heat-resistant protective layer, which will be described later with reference to FIGS. 16 and 20. While the semiconductor light emitting element is transferred from a temporary substrate to the wiring substrate, only an ACP layer 1080, which is formed in a region overlapping with the protective layer 1090, may be selectively transferred together with the semiconductor light emitting element.

Accordingly, as shown in FIG. 11, the ACP layer 1080 may be positioned on side and lower surfaces of the semiconductor light emitting element disposed below the protective layer 1090. Meanwhile, when the semiconductor light emitting element is separated from the temporary substrate, the ACP layer 1080 may be separated and formed into various shapes according to separation conditions and positioned at the periphery of the semiconductor light emitting element. Therefore, the present disclosure is not limited to the shape shown in FIG. 11.

In addition, although the protective layer 1090 protrudes more than the second conductive semiconductor layer 1053 to the sides as shown in FIG. 11, this is merely an example, and the protective layer 1090 may be formed in various ways while the semiconductor light emitting element is transferred. For example, the protective layer may have the same length as the second conductive semiconductor layer 1053, or the protective layer may protrude more than the second conductive semiconductor layer 1053 to one side.

As shown in FIG. 11, the wiring substrate 1010 may include an organic pad 1070 as well as the first electrode 1020 and the second electrode 1040 positioned above the organic pad 1070.

The first electrode 1020 may be electrically connected to the first conductive electrode 1056 of the semiconductor light emitting element by conductive particles of the ACP layer 1080. In addition, the second electrode 1040 may also be electrically connected to the second conductive electrode 1052 of the semiconductor light emitting element by conductive particles of the ACP layer 1080.

For example, the conductive particle 1081 may have a circular shape in the ACP layer 1080, but may be deformed into an oval shape by compression while the semiconductor light emitting element is transferred to the wiring substrate 1010. When the conductive particle exists between the first electrode 1020 and the first conductive electrode 1056, the conductive particle may have an elliptical shape as shown in FIG. 11.

Figure 12:
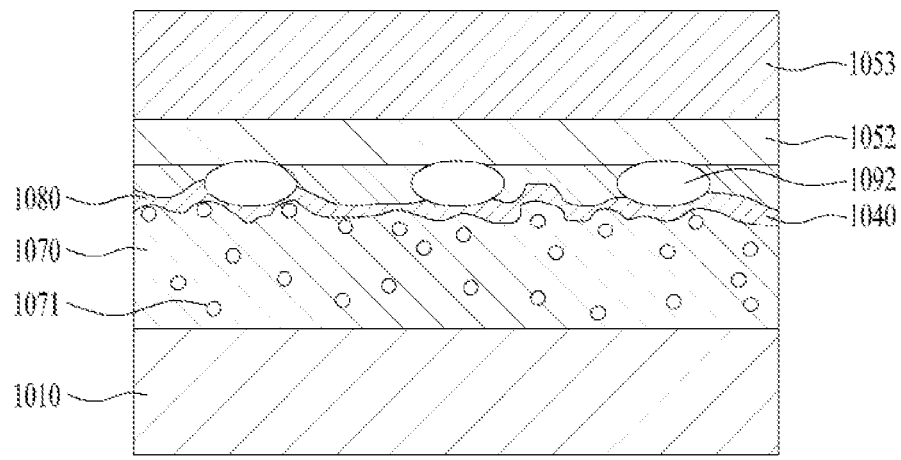
FIG. 12 is an enlarged view of part E of FIG. 11.

FIG. 12 is an enlarged view of part E of FIG. 11.

Part E of FIG. 11 corresponds to a connection part between the second conductive electrode 1052 and the second electrode 1040, which is formed in the second conductive semiconductor layer 1053 of the semiconductor light emitting element.

As shown in FIG. 12, the second electrode 1040 may have a surface roughness structure. The second electrode 1040 may be formed on the organic pad 1070, which is formed above the wiring substrate 1010. The organic pad 1070 may include a plurality of nanoparticles 1071, and at least one nanoparticle may be exposed on the surface of the organic pad 1070 to form an irregular surface shape.

Additionally, the nanoparticles may serve as a resistor to maintain the shape of the organic pad when the wiring substrate is in contact with the conductive particles. The nanoparticles may also serve to improve light extraction efficiency by reflecting emitted light directed to the wiring substrate when the display device is driven.

Figure 13:
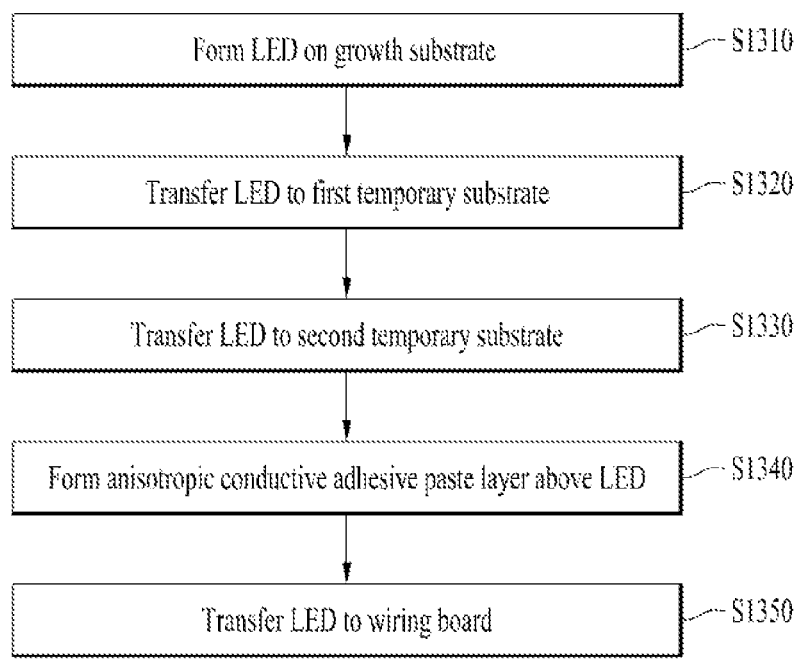
FIG. 13 is a flowchart illustrating a process of manufacturing the display device of FIG. 10.

FIG. 13 is a flowchart illustrating a process of manufacturing the display device of FIG. 10.

First, a semiconductor light emitting element (LED) may be formed on a growth substrate (S1310). A semiconductor light emitting structure may include a first conductive semiconductor layer, an active layer, and a second conductive semiconductor layer. In some cases, the semiconductor light emitting structure may further include a buffer semiconductor layer. In the case of a horizontal-type semiconductor light emitting element, an electrode for electrically connecting each semiconductor layer may be formed in the growth substrate.

Thereafter, the semiconductor light emitting element (LED) may be transferred to a first temporary substrate (S1320). The first temporary substrate may be made of, for example, a flexible material such as polydimethylsiloxane (PDMS) and include a plurality of protrusions.

The transferring step (S1320) may include aligning the growth substrate and the first temporary substrate so that the semiconductor light emitting element overlaps with the protrusions.

In addition, the semiconductor light emitting element grown on the growth substrate may be directly transferred to the first temporary substrate, but in some cases, a semiconductor light emitting element assembled on an extra assembly substrate may be transferred to the first temporary substrate. In this case, the semiconductor light emitting element on the assembly substrate may be a semiconductor light emitting element that is self-assembled in a fluid medium by an electromagnetic field. Therefore, the process sequence described in FIG. 11 is an exemplary configuration for revealing the technical features of present disclosure, and thus the present disclosure is not limited thereto.

The semiconductor light emitting element (LED) transferred to the first temporary substrate may be transferred again to a second temporary substrate (S1330). The second temporary substrate may include a protective layer and a release layer for selectively transferring the semiconductor light emitting element.

The reason why transferring is performed twice by using the temporary substrates is to bring the protective layer into contact with a specific surface of the semiconductor light emitting element.

For example, in the horizontal-type semiconductor light emitting element, a conductive electrode may be formed in only one direction of the semiconductor light emitting element. That is, assuming that one surface of the semiconductor light emitting element in contact with the growth substrate is a first surface, the conductive electrode may be formed on a second surface opposite to the first surface. Since the protective layer needs to be in contact with a surface on which the conductive electrode is not formed, two transfer processes may be required to bring the first surface into contact with the protective layer.

However, the number of times that transferring is performed on temporary substrates may vary according to the direction in which the conductive electrode is formed in the semiconductor light emitting element and other purposes.

Then, an ACP layer may be formed above the semiconductor light emitting element (LED) transferred to the second temporary substrate (S1340).

Finally, the semiconductor light emitting element on which the ACP layer is formed may be transferred to a wiring substrate (S1350).

The transferring step may include a process of irradiating a laser to the rear surface of the second temporary substrate and separating the semiconductor light emitting element therefrom together with the protective layer formed on the second temporary substrate. Details thereof will be described later with reference to FIGS. 18 and 19.

In light of the purpose of the present disclosure, deleting and changing some steps of the flowchart shown in FIG. 13 at a level understandable by those skilled in the art may also be included in the scope of the present disclosure.

Figure 14:
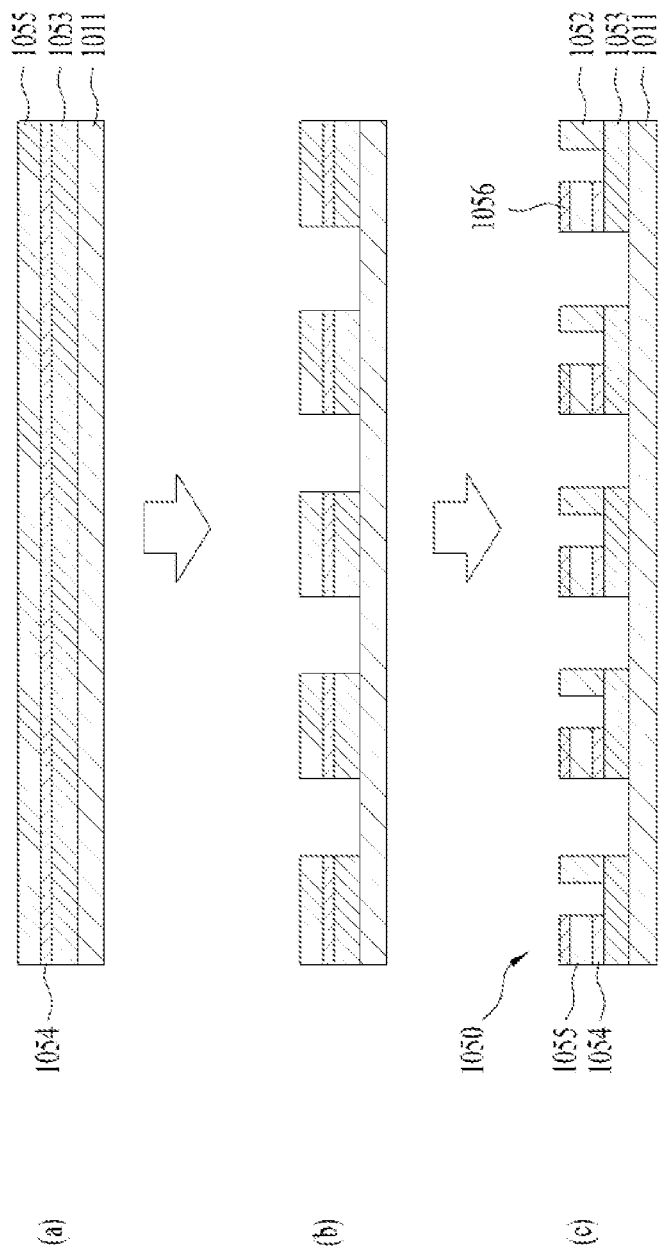
FIG. 14 is a cross-sectional view illustrating a process of forming the semiconductor light emitting element of FIG. 10 on a growth substrate.

FIG. 14 is a cross-sectional view illustrating a process of forming the semiconductor light emitting element of FIG. 10 on a growth substrate.

As shown in FIG. 14(*a*), the second conductive semiconductor layer 1053, active layer 1054, and first conductive semiconductor layer 1055 may be sequentially grown on a growth substrate 1011.

Additionally, a buffer semiconductor layer may be formed between the second conductive semiconductor layer 1053 and the growth substrate 1011. The buffer semiconductor layer may prevent damage to the second conductive semiconductor layer 1053 that may occur while the semiconductor light emitting element grown on the growth substrate 1011 is separated.

The growth substrate 1011 may be made of a light transmissive material such as sapphire (Al2O3), GaN, zinc oxide (ZnO), or aluminum oxide (AlO). The growth substrate 1011 may be made of a material suitable for semiconductor material growth such as a carrier wafer. The growth substrate 1011 may be made of a material with excellent thermal conductivity. The growth substrate 1011 may include a conductive substrate or an insulating substrate, for example, a silicon carbide (SiC) substrate with high thermal conductivity compared to a sapphire (Al2O3) substrate. Alternatively, the growth substrate 1011 may be made of at least one of silicon (Si), gallium arsenide (GaAs), gallium phosphide (GaP), indium phosphide (InP), or Ga2O3. However, the present disclosure is not limited thereto.

The second conductive semiconductor layer 1053 may be an n-type semiconductor layer. For example, the second conductive semiconductor layer 1053 may be a nitride semiconductor layer such as n-GaN. The first conductive semiconductor layer 1055 may be a p-type semiconductor layer. However, the present disclosure is not limited thereto. For example, the first conductivity type may be n-type, and the second conductivity type may be p-type.

According to another embodiment of the present disclosure, the first conductive semiconductor layer 1055 and the second conductive semiconductor layer 1053 may be formed by implanting impurities into an intrinsic or doped semiconductor substrate. Also, a region in which the p-n junction is formed by the impurity implantation may serve as the active layer 1053. The details of the first conductive semiconductor layer 1055, the second conductive semiconductor layer 1053, and the active layer 11054 are merely examples, and the present disclosure is not limited thereto.

As shown in FIG. 14(b), the semiconductor layers grown on the growth substrate may form a plurality of semiconductor light emitting structures isolated from each other based on an etching process.

For example, at least a portion of the first conductivity type semiconductor layer, the active layer, the second conductivity type semiconductor layer, and the buffer semiconductor layer may be etched in order to form a plurality of semiconductor light emitting structures isolated from each other on the substrate. In this case, the etching may proceed until the growth substrate is exposed.

In another example, the etching may be performed between semiconductor light emitting elements until a part of the second conductive semiconductor layer is left.

As shown in FIG. 14(c), the first conductive electrode 1056 and the second conductive electrode 1052 may be formed above a plurality of semiconductor light emitting elements 1050. To form the electrodes 1052 and 1056, a photo process, an etching process, and a metal deposition process may be performed for each electrode. For example, in the case of a horizontal-type semiconductor light emitting element, a plurality of semiconductor light emitting elements 1050, each of which has formed therein the first conductive electrode 1056, second conductive electrode 1052, first conductive semiconductor layer 1055, active layer 1054, and second conductive semiconductor layer 1053, may be formed on the growth substrate 1011. In addition, the semiconductor light emitting element 1050 may further include, for example, a passivation layer formed to surround the side surface of the semiconductor light emitting element 1050.

Figure 15:
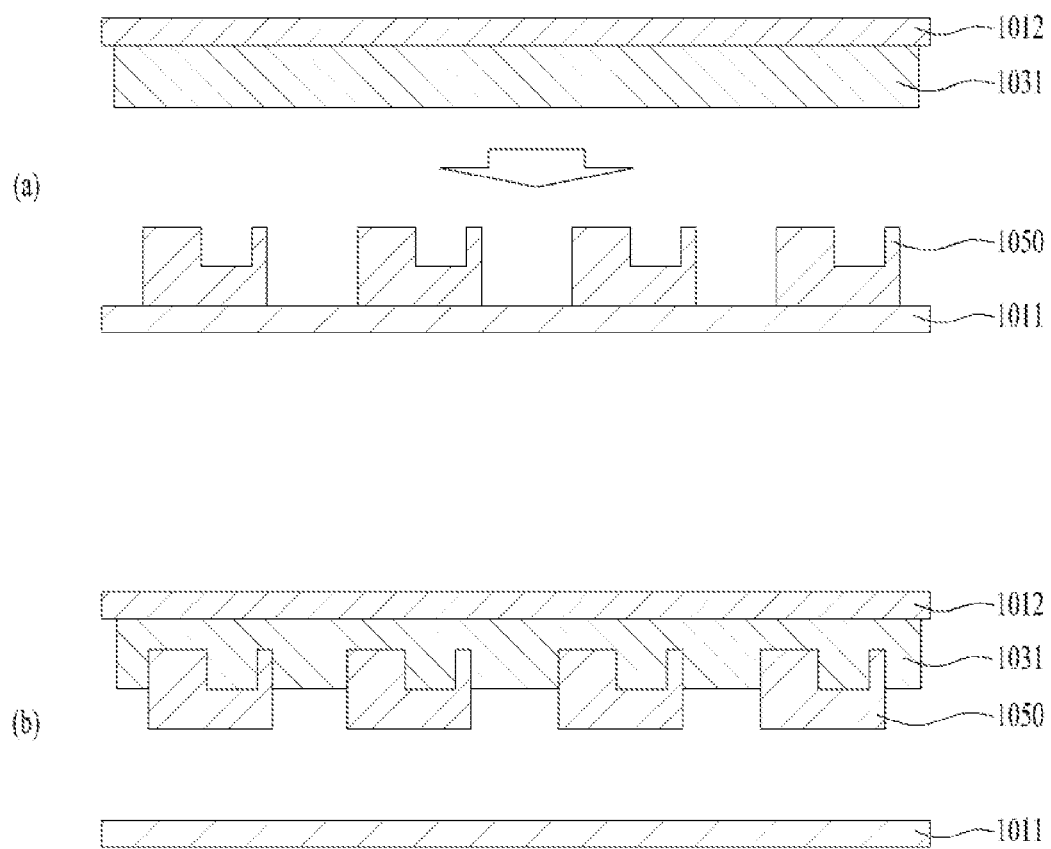
FIG. 15 is a view illustrating a process of transferring the semiconductor light emitting element of FIG. 14 to a first temporary substrate.

FIG. 15 is a view illustrating a process of transferring the semiconductor light emitting element of FIG. 14 to a first temporary substrate.

As shown in FIG. 15(a), the semiconductor light emitting elements 1050 on the growth substrate 1011 may be transferred to a first temporary substrate 1012 by an adhesive film 1031 disposed on the first temporary substrate 1012.

During the transfer process, a laser lift-off (LLO) process may be performed to selectively separate the semiconductor light emitting elements 1050 from the growth substrate 1011. In other words, when a laser is irradiated to the semiconductor light emitting elements 1050 to be separated from the growth substrate 1011, the corresponding semiconductor light emitting elements 1050 may be separated from the growth substrate 1011. The adhesive film 1031 on the first temporary substrate 1012 may be a flexible film suitable for selective transfer.

Accordingly, as shown in FIG. 15(b), all the semiconductor light emitting elements 1050 separated from the growth substrate 1011 may be adhered to the adhesive film 1031 of the first temporary substrate 1012. Since the adhesive film 1031 is flexible, the semiconductor light emitting elements 1050 may be stably fixed to the adhesive film 1031.

Figure 16:
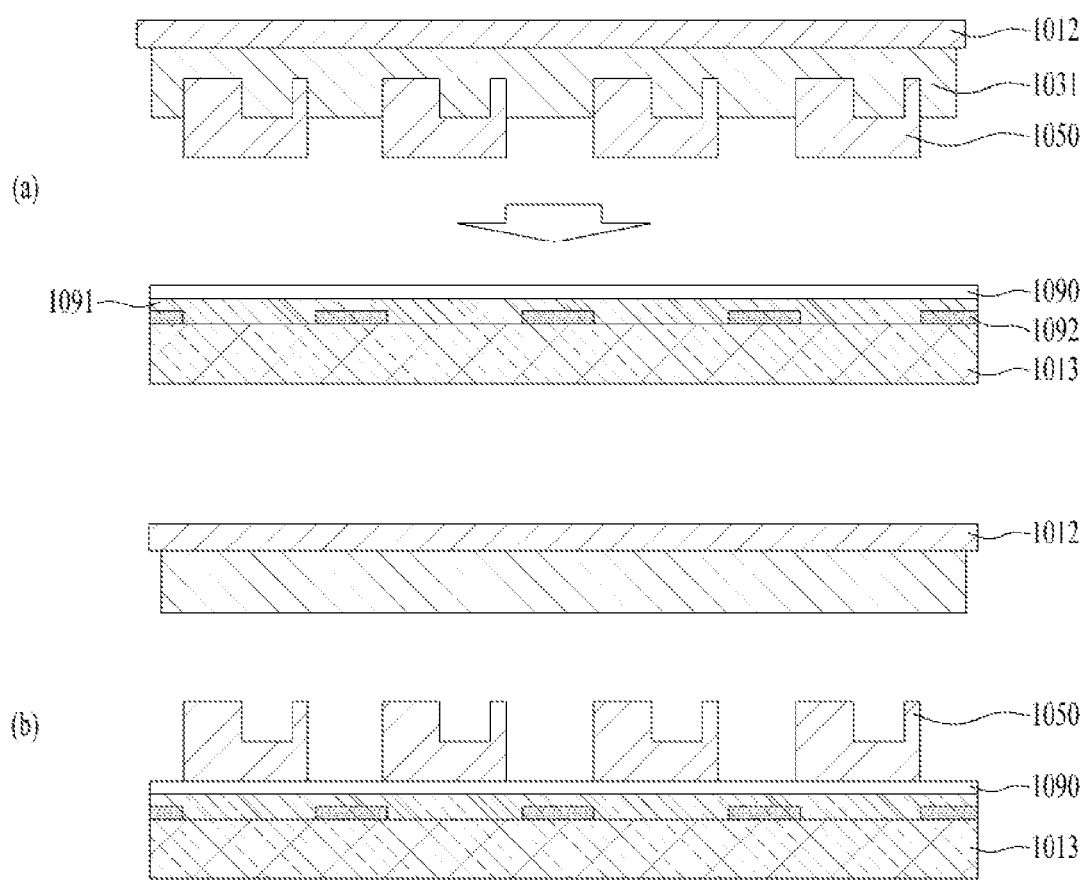
FIG. 16 is a view illustrating a process of transferring the semiconductor light emitting element of FIG. 15 to a second temporary substrate.

FIG. 16 is a view illustrating a process of transferring the semiconductor light emitting element of FIG. 15 to a second temporary substrate.

As shown in FIG. 16(a), a second temporary substrate 1013 may include the protective layer 1090, a release layer 1091 formed below the protective layer, and a release laser reflective layer 1092.

To transfer the semiconductor light emitting elements 1050 to the second temporary substrate 1013, the first temporary substrate 1012 and the second temporary substrate 1013 may be compressed and then separated.

The protective layer 1090 of the second temporary substrate 1013 may include an adhesive component. The adhesive force by the adhesive component may be stronger than the adhesive force of the adhesive film 1031 of the first temporary substrate 1012. Therefore, as shown in FIG. 16(b), the semiconductor light emitting elements 1050 may be stably separated from the first temporary substrate 1012 and then attached to the protective layer 1090 of the second temporary substrate 1013.

Figure 17:
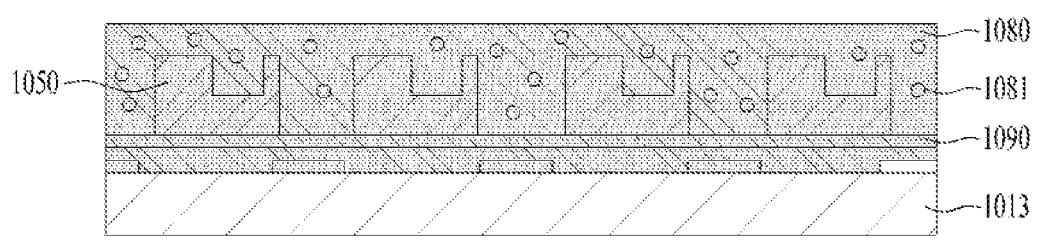
FIG. 17 is a cross-sectional view after forming an anisotropy conductive adhesive paste layer on the semiconductor light emitting element on the second temporary substrate of FIG. 16.

FIG. 17 is a cross-sectional view after forming the ACP layer on the semiconductor light emitting element on the second temporary substrate of FIG. 16.

As shown in FIG. 17, the ACP layer 1080 containing the conductive particles 1081 may be coated on the semiconductor light emitting element 1050 positioned above the protective layer 1090 of the second temporary substrate 1013.

To coat the ACP layer 1080, one of various methods such as spin coating, bar coating, and slit coating may be used.

In addition, the ACP layer 1080 may include titanium dioxide (TiO2) nanoparticles for improving luminance of the semiconductor light emitting element or silica nanoparticles for improving coating properties.

Figure 18:
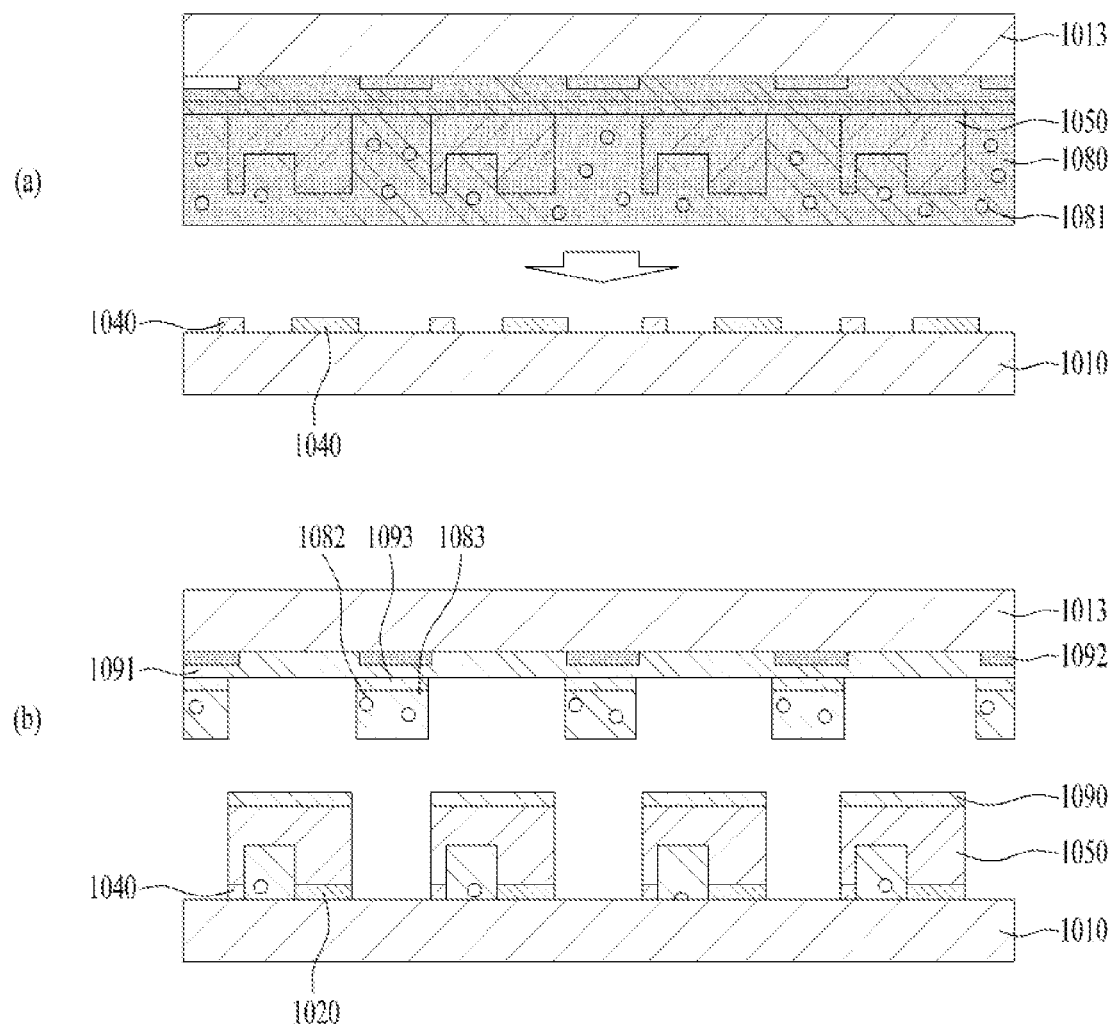
FIG. 18 is a view illustrating a process of transferring the semiconductor light emitting element of FIG. 17 to a wiring substrate.

FIG. 18 is a view illustrating a process of transferring the semiconductor light emitting element of FIG. 17 to the wiring substrate.

As shown in FIG. 18(a), the semiconductor light emitting elements 1050 positioned on the second temporary substrate 1013 may be reversed and transferred so that the semiconductor light emitting elements 1050 face the wiring substrate 1010. That is, the ACP layer 1080 including the conductive particles 1081, which is coated on the semiconductor light emitting element 1050, may be positioned to be in contact with the first electrode 1020 and the second electrode 1040 formed on the wiring substrate 1010.

Thereafter, the second temporary substrate 1013 and the wiring substrate 1010 may be compressed, and a laser may be irradiated to the rear surface of the second temporary substrate 1013 to separate the protective layer and the release layer formed on the second temporary substrate.

FIG. 18(b) is a view illustrating a shape after the semiconductor light emitting elements 1050 are transferred from the second temporary substrate 1013 to the wiring substrate 1010.

The release laser reflective layer 1092 and the release layer 1091 may be positioned on the second temporary substrate 1013 as they are, but a partial protective layer 1093 and a partial ACP layer 1083 including conductive particles 1082 may remain on the second temporary substrate 1013.

The protective layer 1093 and the ACP layer 1083 including the conductive particles 1082 may be parts existing between the semiconductor light emitting elements previously positioned on the second temporary substrate 1013.

That is, during the transfer process, both the protective layer 1090 positioned on the semiconductor light emitting element 1050 and the ACP layer surrounding the semiconductor light emitting element 1050 may be transferred to the wiring substrate 1010.

As shown in FIG. 18(b), the first electrode 1020 and the second electrode 1040 may be positioned on the wiring substrate 1010, and the semiconductor light emitting element 1050 may be disposed on the electrodes 1020 and 1040. The protective layer 1090 may be provided on the upper surface of the semiconductor light emitting element 1050. The ACP layer may be positioned on the sides of the semiconductor light emitting element 1050 and between the semiconductor light emitting element 1050 and the electrodes 1020 and 1040. In addition, the ACP layer between the electrodes 1020 and 1040 and the semiconductor light emitting element 1050 may be compressed during the transfer process, and the semiconductor light emitting element 1050 and the electrodes 1020 and 1040 may be electrically connected by the conductive particles of the ACP layer.

In the prior art, when an anisotropic conductive adhesive film is used to connect semiconductor light emitting elements with wiring electrodes, a short or open defect is highly likely to occur between the semiconductor light emitting elements due to conductive particles included in the conductive film. That is, when the concentration of the conductive particles is low, it may be difficult to establish an electrical connection between the electrodes based on the conductive particles. On the other hand, when the amount of the conductive particles is excessive, the conductive particles may act as wiring even in an undesired region, for example, between the elements, thereby causing short-circuit failure. Therefore, controlling the concentration of the conductive particles is an important issue in the prior art, but there are various variables such as adhesion pressure and the size of the conductive particle so that it is difficult to configure an appropriate concentration point.

However, according to the present disclosure, since the ACP layer is used, and at the same time, the ACP layer is selectively formed only on the conductive electrode part of each semiconductor light emitting element and the periphery thereof, defect problems due to the conductive particles may be minimized.

Figure 19:
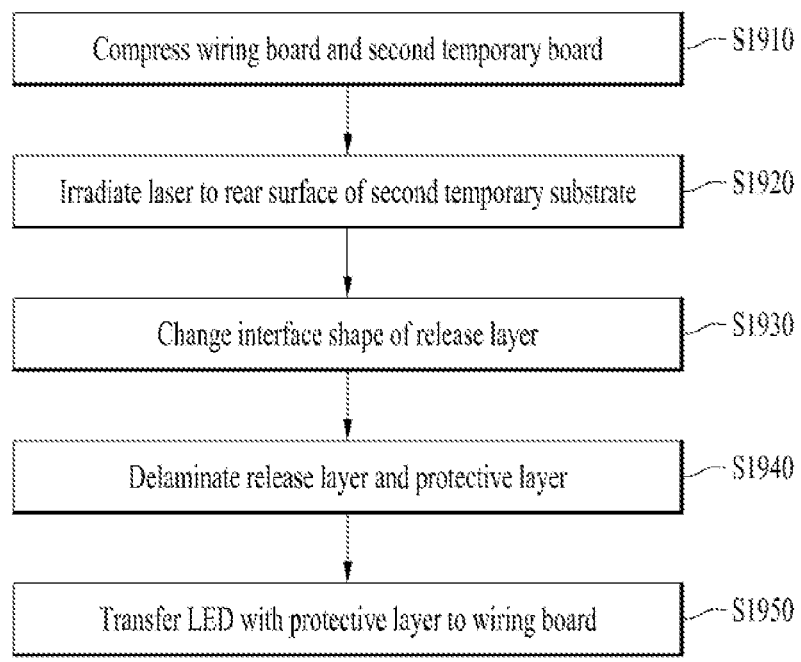
FIG. 19 is a flowchart illustrating a process of transferring the semiconductor light emitting element of FIG. 18 to a wiring substrate.

FIG. 19 is a flowchart illustrating a process of transferring the semiconductor light emitting element of FIG. 18 to the wiring substrate.

As briefly described above with reference to FIG. 18, the wiring substrate and the second temporary substrate may be disposed to face each other and compressed (S1910).

Thereafter, a laser may be irradiated to the rear surface of the second temporary substrate (S1920). The laser may be an ultraviolet (UV) light laser or a visible light laser. The travel direction of the laser is as follows: the second temporary substrate, the release laser reflective layer formed on the second temporary substrate, and the release layer. When the laser is irradiated to the release laser reflective layer, the laser may not go straight anymore but be reflected, so that it is difficult for the laser to affect the release layer and the protective layer located above the release laser reflective layer. However, in a region where the release laser reflection layer is not formed, the laser may affect the release layer and the protective layer formed above the release layer.

The release layer may observe energy corresponding to the wavelength of the laser, and thus heat is generated by the laser. Accordingly, the interface shape of the release layer may be changed by the heat (S1930).

On the other hand, the protective layer formed above the release layer may be made of a high heat-resistant material capable of withstanding the heat generated by the laser. Accordingly, the shape of the release layer may vary due to vaporization by the laser, whereas the shape of the protective layer may be maintained as it is. Therefore, as the laser irradiation time increases, the release layer may be delaminated from the protective layer (S1940).

On the other hand, the ACP layer located on the conductive electrodes of the semiconductor light emitting element and the periphery thereof, which is formed on the opposite surface of the protective layer, may be in strong contact with the wiring substrate during the pressing step (S1910). Thus, strong adhesion may be maintained between the wiring substrate and the semiconductor light emitting element.

Therefore, when the wiring substrate and the second temporary substrate are separated after pressing, the semiconductor light emitting element on the second temporary substrate may be transferred to the wiring substrate together with the protective layer previously formed on the second temporary substrate (S1950). That is, only the semiconductor light emitting element and the protective layer overlapping the semiconductor light emitting element may be transferred together by interfacial delamination from the release layer. This is because there is no release laser reflective layer formed in a region where the semiconductor light emitting element is located on the second temporary substrate so that the region is affected by the laser. On the other hand, the release laser reflective layer may be provided in a region where the semiconductor light emitting element is not located on the second temporary substrate, and thus, there may be no effects of the laser, so that there may be no delamination between the release layer and the protective layer. Details of the formation process and structure of the release layer and the release laser reflective layer will be described later with reference to FIG. 20.

In light of the purpose of the present disclosure, deleting and changing some steps of the flowchart shown in FIG. 19 at a level understandable by those skilled in the art may also be included in the scope of the present disclosure.

Figure 20:
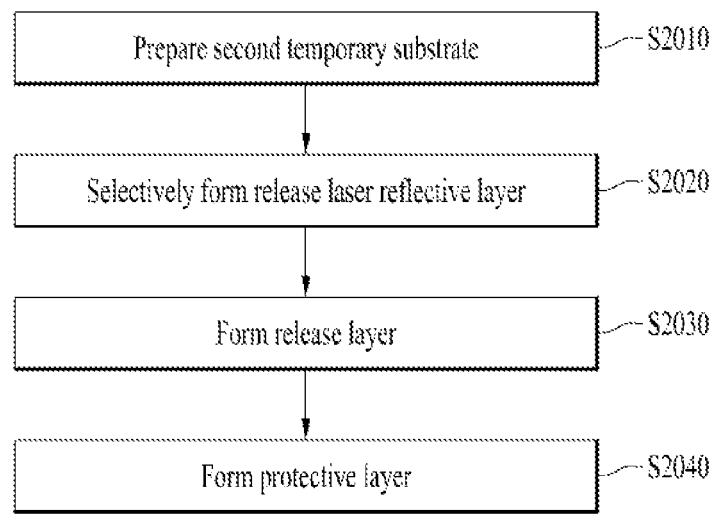
FIG. 20 is a flowchart illustrating a process of forming a multi-layer structure on the second temporary substrate for selectively transferring the semiconductor light emitting element and the anisotropy conductive adhesive paste layer.

FIG. 20 is a flowchart illustrating a process of forming a multi-layer structure on the second temporary substrate for selective transferring the semiconductor light emitting element and the ACP layer.

First, the second temporary substrate may be prepared (S2010). The release laser reflective layer may be selectively formed on the substrate (S2020). A photo process and an etching process may be performed for the selective formation. In addition, physical vapor deposition PVD process or a sputtering process may be performed to form the reflective layer.

The selective formation refers to formation of the release laser reflective metal layer in a region of the second temporary substrate where the semiconductor light emitting element is not transferred. For convenience, a region of the second temporary substrate where the semiconductor light emitting element is not transferred is defined as a first region, and a region of the second temporary substrate where the semiconductor light emitting element is transferred is defined as a second region.

Thereafter, the release layer may be formed (S2030). The release layer may be formed on the entirety of the second temporary substrate including the release laser reflective layer.

The release layer may include at least one of ITO, amorphous silicon, black carbon, or resin including TiO2 nanoparticles.

Finally, the protective layer may be formed above the release layer (S2040). The protective layer may include UV resin or thermosetting resin. Therefore, the protective layer may be hardened by a laser used in the transfer process, and thus interfacial delamination from the release layer formed below the protective layer may be accelerated.

In addition, when the semiconductor light emitting element is transferred to the wiring substrate, the protective layer may be transferred together so that the protective layer may form a specific refractive index in consideration of the refractive index of the semiconductor light emitting element. Specifically, a first refractive index of the protective layer may be smaller than a second refractive index of the semiconductor light emitting element. For example, when the semiconductor light emitting element is made of GaN, the refractive index of the semiconductor light emitting element is about 2.4. Thus, the refractive index of the protective layer may be set to a value between 1.5 and 2.3, thereby preventing light emitted from the semiconductor light emitting element from being totally reflected back into the element.

In light of the purpose of the present disclosure, deleting and changing some steps of the flowchart shown in FIG. 20 at a level understandable by those skilled in the art may also be included in the scope of the present disclosure.

Figure 21:
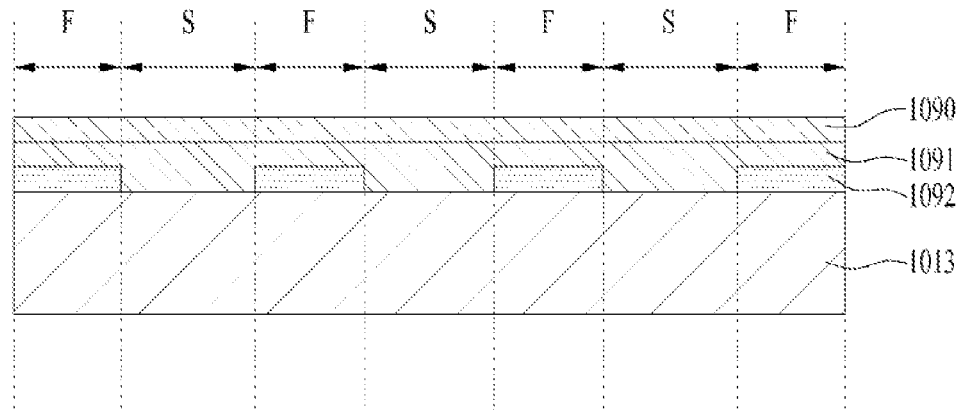
FIG. 21 is a cross-sectional view illustrating the multi-layer structure of the second temporary substrate formed according to the method of FIG. 20.

FIG. 21 is a cross-sectional view illustrating the multi-layer structure of the second temporary substrate formed according to the method of FIG. 20.

As shown in FIG. 21, a release laser protection layer 1092 may be selectively positioned on the second temporary substrate 1013. In addition, the release layer 1091 and the protective layer 1090 may be positioned over the entirety of the second temporary substrate 1013 including the release laser protective layer.

A region in which the release laser protection layer 1092 is located corresponds to region F as shown in FIG. 21. On the other hand, region S of FIG. 21 is a region in which the release laser protection layer is not formed. That is, the semiconductor light emitting element may be located in region S during the transfer process.

Therefore, when a laser is irradiated to the rear surface of the second temporary substrate 1013, the laser may affect the release layer 1091 and the protective layer 1090 in region S, but the laser may not affect the release layer 1091 and the protective layer 1090 in region F due to the release laser reflective layer 1092 in region F.

Figure 22:
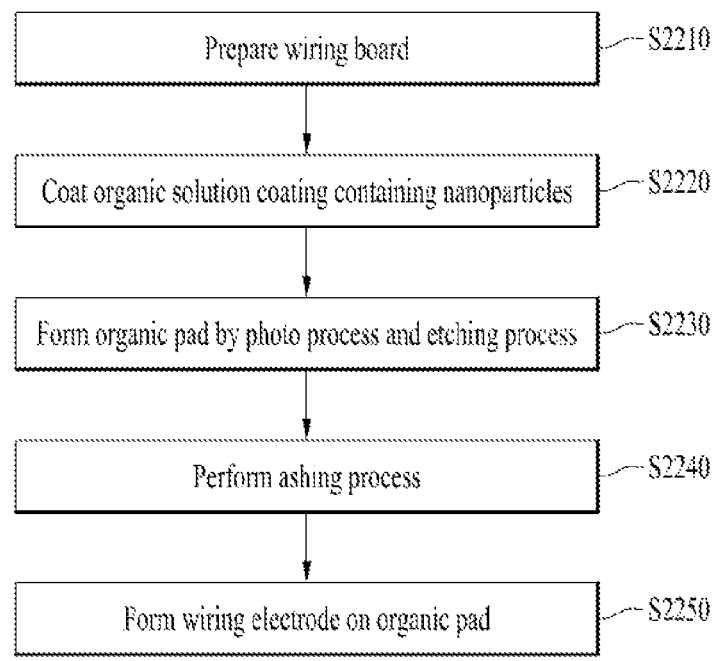
FIG. 22 is a flowchart illustrating a process of manufacturing a wiring electrode with a surface roughness structure.

FIG. 22 is a flowchart illustrating a process of manufacturing a wiring electrode with a surface roughness structure.

First, the wiring substrate may be prepared (S2210). Thereafter, an organic solution containing nanoparticles may be coated on the wiring substrate (S2220).

The organic solution may be present on the wiring electrode in the form of an organic layer where volatile components are removed. Thereafter, a photo process and an etching process may be performed on the organic layer to form an organic pad at a position corresponding to the conductive electrode part of the semiconductor light emitting element (S2230).

An ashing process may be performed to change the surface shape of the organic pad (S2240). Finally, the wiring electrode may be formed on the organic pad (S2250).

The ashing process may allow the surface of the organic pad to have the irregular surface roughness structure. Accordingly, the wiring electrode formed on the organic pad may also have a irregular surface roughness structure, which will be described in detail with reference to FIG. 23.

In light of the purpose of the present disclosure, deleting and changing some steps of the flowchart shown in FIG. 22 at a level understandable by those skilled in the art may also be included in the scope of the present disclosure.

Figure 23:
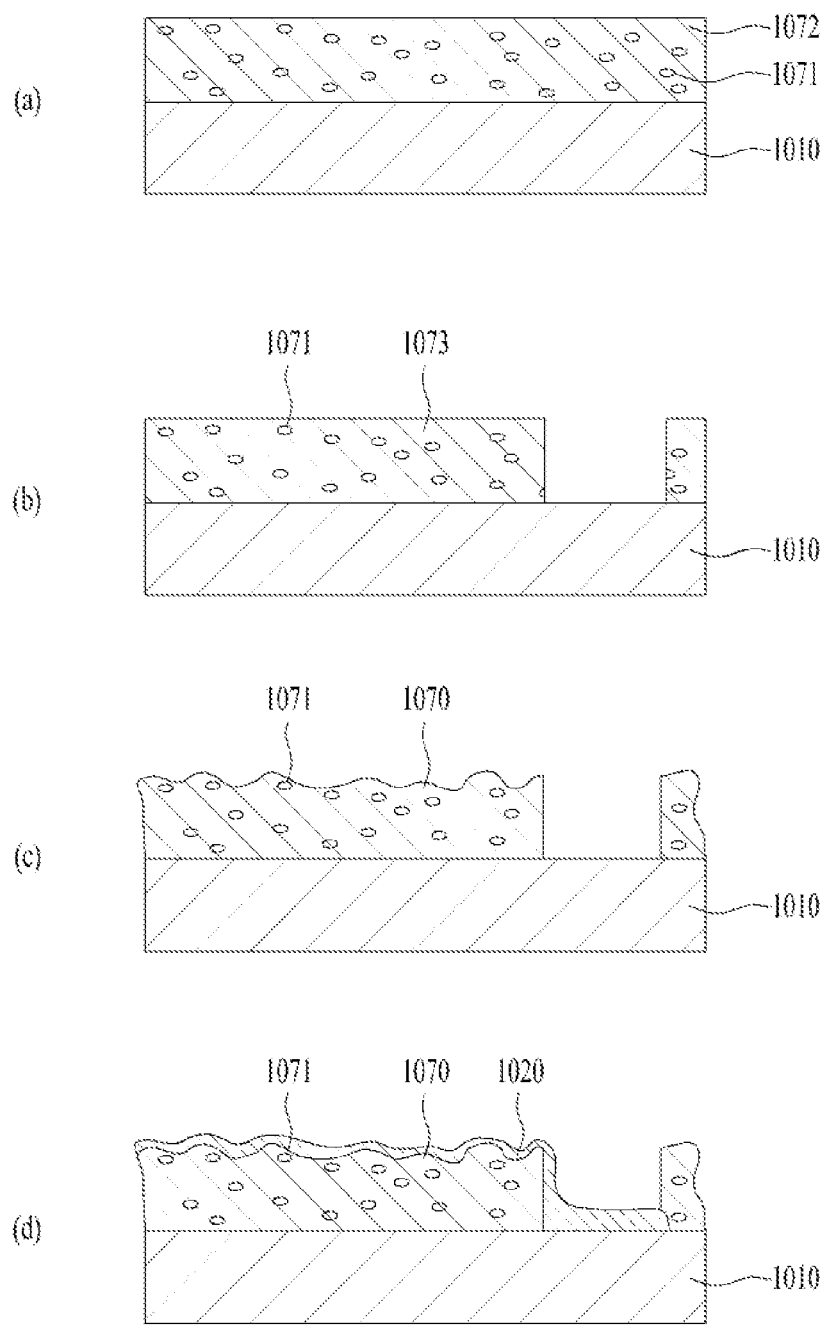
FIG. 23 is a cross-sectional view illustrating a process of manufacturing the wiring electrode having the surface roughness structure.

FIG. 23 is a cross-sectional view illustrating a process of manufacturing the wiring electrode having the surface roughness structure.

FIG. 23(a) is a cross-sectional view after forming an organic layer 1072 containing the nanoparticles 1071 on the wiring substrate 1010.

As described above, an organic solution containing the nanoparticles 1071 may be coated on the wiring substrate 1010. In this case, spin coating may be used. In the spin coating, the coating thickness may be controlled relatively simply by adjusting the rotation speed and time, and thus the spin coating may be advantageous for coating an organic solution in a large area. However, the above coating method is merely an example, and the present disclosure is not limited thereto.

Thereafter, volatile components (solvent) of the organic solution may be removed by a soft baking process, and the organic layer 1072 may be solidified on the wiring substrate 1010.

The organic layer 1072 may include, for example, photosensitive organic components. The photosensitive organic components may be photosensitive acrylates or photoactive compounds (PAC).

In addition, the nanoparticles 1071 may be, for example, an inorganic material or metal component with a size of 10 nm to 300 nm.

Thereafter, as shown in FIG. 23(b), a photo process and an etching process may be performed on the organic layer 1072 to form an organic pad 1073 at a position corresponding to the conductive electrode part of the semiconductor light emitting element.

To change the surface shape of the organic pad 1073, an ashing process may be performed on the organic pad 1073.

FIG. 23(c) is a cross-sectional view illustrating the shape of the organic pad after ashing.

The ashing process may expose the surface of the organic pad to O2 plasma for several seconds to deform the shape of the surface of the organic pad. Since the O2 plasma is capable of effectively removing organic matter rather than nanoparticles, the nanoparticles 1071 in the organic pad may be exposed to the surface of the organic pad 1070 as the plasma treatment continues. After the ashing process, the surface of the organic pad 1070 may have the surface roughness structure.

Then, the wiring electrode 1020 may be formed on the organic pad 1070 having the surface roughness structure as shown in FIG. 23 (d). Accordingly, the surface of the wiring electrode 1020 may also have an irregular surface roughness structure due to the nanoparticles 1071 protruding from the surface of the organic pad 1070.

Hereinafter, reasons why the surface roughness structure and the organic pad are effective in the wiring electrode 1020 positioned on the wiring substrate 1010 will be described.

As described above, the wiring electrode may be electrically connected to the conductive electrode part of the semiconductor light emitting element. According to the present disclosure, the ACP layer may exist between the electrode part and the wiring electrode, which are electrically connected by conductive particles in the ACP layer. Accordingly, if the conductive particles are not accurately in contact with the conductive electrode part or the wiring electrode, a defect may occur. Even if the conductive particles are accurately in contact, the wiring electrode or the conductive electrode part may be damaged by strong impacts during a bonding process.

Since the surface roughness structure may increase the contact area with the conductive particles, the adhesion strength and adhesion probability between the conductive particles and the wiring electrode may also increase, thereby preventing defects. In addition, the organic pad formed below the wiring electrode may mitigate the impact generated during bonding between the conductive particles and the wiring electrode, thereby preventing the wiring electrode from being damaged.

In summary, according to the present disclosure, the semiconductor light emitting element may be transferred to the wiring substrate by using the ACP layer and, the wiring process may be performed at the same time. The ACP layer may be formed only in a region where the semiconductor light emitting element is connected to the wiring electrode and the periphery thereof, thereby reducing the risk of a short circuit between elements. In addition, the wiring electrode may have the surface roughness structure, and the organic pad may be provided below the wiring electrode. This may facilitate contact with the conductive particles of the ACP layer and mitigate impacts upon contact. Therefore, according to the present disclosure, the semiconductor light emitting element may be stably transferred to the wiring substrate and at the same time, the wiring process for minimizing short and open defects may be performed.

The above description is merely illustrative of the technical idea of the present disclosure. Those of ordinary skill in the art to which the present disclosure pertains will be able to make various modifications and variations without departing from the essential characteristics of the present disclosure.

Therefore, embodiments disclosed in the present disclosure are not intended to limit the technical idea of the present disclosure, but to describe, and the scope of the technical idea of the present disclosure is not limited by such embodiments.

The scope of protection of the present disclosure should be interpreted by the claims below, and all technical ideas within the scope equivalent thereto should be construed as being included in the scope of the present disclosure.

What is claimed is:

1. A display device, comprising:
    a substrate;
    an organic pad positioned above the substrate;
    a wiring electrode positioned on the organic pad, wherein the organic pad has a rough surface on which the wiring electrode is formed;
    an anisotropy conductive adhesive paste layer having conductive particles and positioned on the wiring electrode;
    a semiconductor light emitting element positioned on the anisotropy conductive adhesive paste layer and electrically connected to the wiring electrode by the conductive particles of the anisotropy conductive adhesive paste layer; and
    a protective layer provided at an upper surface of the semiconductor light emitting element and not connected to the wiring electrode,
    wherein the organic pad comprises a plurality of nanoparticles, wherein at least one nanoparticle among the plurality of nanoparticles is exposed at the rough surface of the organic pad.

2. The display device of claim 1, wherein the semiconductor light emitting element has a horizontal-type semiconductor light emitting structure comprising:
    a first conductive semiconductor layer;
    an active layer;
    a second conductive semiconductor layer;
    a first conductive electrode positioned on the first conductive semiconductor layer; and
    a second conductive electrode positioned such that the second conductive semiconductor layer is exposed based on partial etching of the first conductive semiconductor layer and the active layer.

3. The display device of claim 2, wherein the second conductive semiconductor layer of the semiconductor light emitting element is in contact with the protective layer, and
    wherein the first conductive electrode and the second conductive electrode of the semiconductor light emitting element are in contact with the anisotropy conductive adhesive paste layer.

4. The display device of claim 3, wherein the protective layer extends further laterally than at least one side of the second conductive semiconductor layer.

5. The display device of claim 1, wherein the protective layer is made of ultraviolet (UV) resin or thermosetting resin.

6. The display device of claim 1, wherein a first refractive index of the protective layer is less than a second refractive index of the semiconductor light emitting element.

7. The display device of claim 6, where the first refractive index is in a range of 1.5 and 2.3.

8. The display device of claim 1, wherein the semiconductor light emitting element is a light emitting diode (LED) with a size in micrometers.

9. The display device of claim 1, wherein the wiring electrode has a rough surface.

10. The display device of claim 1, wherein the nanoparticles reflect emitted light directed to the wiring substrate for improving light extraction efficiency.

* * * * *